(12) United States Patent
Chen et al.

(10) Patent No.: US 10,319,420 B2
(45) Date of Patent: Jun. 11, 2019

(54) SENSE AMPLIFIER WITH NON-IDEALITY CANCELLATION

(71) Applicant: SanDisk Technologies LLC, Plano, TX (US)

(72) Inventors: Yingchang Chen, San Jose, CA (US); Chun-Ju Chu, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 4 days.

(21) Appl. No.: 15/789,638

(22) Filed: Oct. 20, 2017

(65) Prior Publication Data

US 2018/0294017 A1 Oct. 11, 2018

Related U.S. Application Data

(60) Provisional application No. 62/483,912, filed on Apr. 10, 2017.

(51) Int. Cl.

| *G11C 7/06* | (2006.01) |
|---|---|
| *G11C 7/10* | (2006.01) |
| *G11C 7/14* | (2006.01) |
| *G11C 7/08* | (2006.01) |
| *G11C 7/02* | (2006.01) |
| *G11C 7/12* | (2006.01) |
| *G11C 29/02* | (2006.01) |

(52) U.S. Cl.
CPC .............. *G11C 7/1051* (2013.01); *G11C 7/02* (2013.01); *G11C 7/062* (2013.01); *G11C 7/067* (2013.01); *G11C 7/08* (2013.01); *G11C 7/106* (2013.01); *G11C 7/12* (2013.01); *G11C 7/14* (2013.01); *G11C 29/021* (2013.01); *G11C 29/028* (2013.01)

(58) Field of Classification Search
CPC ............ G11C 7/1051; G11C 7/08; G11C 7/14
USPC .................................................. 365/189.07
See application file for complete search history.

(56) References Cited

U.S. PATENT DOCUMENTS

| 9,123,430 B2 | 9/2015 | Cernea |
|---|---|---|
| 2007/0002630 A1 | 1/2007 | Gallo et al. |
| 2013/0083590 A1 | 4/2013 | Yadav et al. |
| 2016/0276023 A1 | 9/2016 | Chen et al. |
| 2016/0343422 A1 | 11/2016 | Marotta et al. |
| 2016/0358648 A1 | 12/2016 | Park et al. |

(Continued)

*Primary Examiner* — Huan Hoang
(74) *Attorney, Agent, or Firm* — Brinks Gilson & Lione

(57) ABSTRACT

A sense circuit includes memory cell characterization circuitry, storage circuitry, switching circuitry, and bit line biasing circuitry. The sense circuit is configured to perform a sense operation to sense a characterization of a memory cell. During a pre-charge phase, the memory cell characterization circuitry and the bit line biasing circuitry set differential voltages in the storage circuitry to levels dependent on input offset voltages according to certain polarities. The storage circuitry maintains the differential voltages during the sense phase, allowing the memory cell characterization circuitry to cancel output the input offset voltages when generating output voltages used to identify a characterization of the memory cell. The memory cell characterization circuitry also generates its output voltage based on a reference current through a reference bit line. Doing so may allow the memory cell characterization circuitry to cancel out background noise current generated on the bit line during the sense operation.

20 Claims, 6 Drawing Sheets

(56) References Cited

U.S. PATENT DOCUMENTS

2017/0194055 A1    7/2017   Qian et al.
2018/0144778 A1*  5/2018   Jeong ........................ G11C 7/04

* cited by examiner

SENSE AMPLIFIER WITH NON-IDEALITY CANCELLATION

CROSS-REFERENCE TO RELATED APPLICATION

This application claims the benefit of priority to U.S. Provisional Application No. 62/483,912, filed Apr. 10, 2017. The contents of U.S. Provisional Application No. 62/483,912 are hereby incorporated by reference in their entirety.

BACKGROUND

In storage devices, sense amplifiers are included to sense current flowing through bit lines in order to determine characterizations of memory cells, such as the data values of the data that memory cells are storing or whether the memory cells have been sufficiently programmed. Such sense amplifiers are generally implemented as low-scale components in the storage device, meaning that they make determinations based on relatively small amounts of current or small amounts of voltage, and thus are generally rather sensitive components. As an example, a deviation on the order of nanoamps could be the difference in whether a sense amplifier determines an associated memory cell is storing a logic 1 value or a logic 0 value. Consequently, slight fluctuations in currents or voltages generated in the sense amplifier can lead to the sense amplifier identifying a wrong characterization of the memory cell.

In actual implementation, non-idealities may encountered that can negatively affect the performance of a sense amplifier. For example, environmental noise on the bit line may cause fluctuations in the bit line current that, in turn, can cause the sense amplifier to identify incorrect characterization of the memory cell. Additionally, circuit components that have two input terminals, such amplifiers, are prone to providing outputs with an amount of error because of their input offset voltages. At the same time, it is desirable for sense amplifiers to determine a characterization of an associated memory cell as fast as possible. Thus, ways to configure a sense amplifier that allows for fast operation while minimizing the effects of non-idealities may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

Figure 1A:
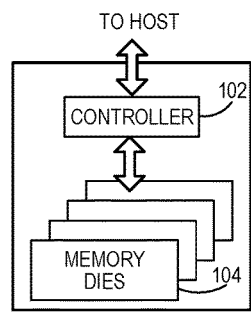
FIG. 1A is a block diagram of an exemplary non-volatile memory system.

By way of introduction, the below embodiments relate to apparatuses, devices, systems, circuits and related methods for performing sense operations with a sense circuit. In one embodiment, a circuit includes a memory cell, a bit line coupled to the memory cell, an amplifier, and a comparator. The amplifier is configured to, during a first time period: set a first voltage to a predetermined voltage level adjusted by an input offset voltage of the amplifier according to a first polarity, and set a second voltage to the predetermined voltage level. In addition, during a second time period, the amplifier is configured to generate a first comparison voltage in response to a first sum input voltage dependent on the predetermined voltage level adjusted by the input offset voltage according to the first polarity and the input offset voltage according to a second polarity opposite the first polarity, and generate a second comparison voltage in response to a second sum input voltage. The comparator is configured to, upon completion of the second period, compare a voltage level of the first comparison voltage and a voltage level of the second comparison voltage, and output an output signal indicative of a characterization of the memory cell in response to the comparison.

In some embodiments, a second amplifier is configured to generate a third voltage that biases the bit line.

In some embodiments, the second amplifier is configured to: during the first time period, generate the third voltage to set a differential voltage of a charge-storing circuit to depend on a second input offset voltage of the second amplifier according to a third polarity; and during the second time period, generate the third voltage to depend on the second input offset voltage according to a fourth polarity opposite the third polarity. Also, the first amplifier is configured to, during the second time period, generate the first comparison voltage in response to the first sum input voltage further dependent on the differential voltage of the charge storing circuit and the third voltage dependent on second input offset voltage according to the fourth polarity.

In some embodiments, the circuit includes a second charge-storing circuit and a switch connected in parallel with the second charge storing circuit. During the first time period, the switch is configured to turn on to bias the bit line and to set a second differential voltage of the second charge-storing circuit to an initial voltage level.

In some embodiments, during the second time period, the switch is configured to turn off; and in response to the switch turning off, the second charge-storing circuit is configured to draw current and change the second differential voltage by a sense voltage amount indicative of current flow through the second charge-storing circuit during the second period.

In some embodiments, a first switch is configured to connect a first output terminal of the amplifier to a first input terminal of the amplifier, and a second switch is configured to connect a second output terminal of the amplifier to a second input terminal of the amplifier. Also, the first switch and the second switch are configured to turn on during the first time period, and the first switch and the second switch are configured to turn off during the second time period.

In some embodiments, the comparator is configured to cancel out the predetermined voltage level during comparison of the voltage levels of the first comparison voltage and the second comparison voltage.

In some embodiments, the first polarity comprises a negative polarity and the second polarity comprises a positive polarity.

In some embodiments, during the second time period, a charge-storing circuit and a reference bit line coupled to the charge-storing circuit are configured to draw a current. The charge-storing circuit is configured to change a differential voltage by a sense voltage amount based on the current drawn during the second time period, and the amplifier is configured to generate the second comparison voltage in response to the second sum input voltage based on the sense voltage amount.

In another embodiment, a circuit includes an amplifier, storage circuitry, switching circuitry, and a comparator. The storage circuitry is configured to, during a sense phase of a sense operation, maintain a first differential voltage based on a first voltage; and maintain a second differential voltage based on a second voltage. The switching circuitry is configured to, during a pre-charge phase of the sense operation: connect a first output terminal of the amplifier to a first node of a first input terminal of the amplifier to generate the first voltage; and connect a second output terminal of the amplifier to a second node of a second input terminal of the amplifier to generate the second voltage. Additionally, during the sense phase, the switching circuitry is configured to disconnect the first output terminal from the first node and the second output terminal from the second node. Also, the amplifier, in response to the disconnection, is configured to generate a first comparison voltage based on the first differential voltage and a second comparison voltage based on the second differential voltage. The comparator is configured to indicate a behavior of a memory cell in response to being biased during the sense operation based on the first comparison voltage and the second comparison voltage upon completion of the sense phase.

In some embodiments, a second amplifier is configured to generate an output voltage to bias a bit line coupled to the memory cell.

In some embodiments, the second amplifier is configured to, during the pre-charge phase, generate the output voltage to set the first differential voltage to depend on an input offset voltage of the second amplifier according to a first polarity. In addition, during the sense phase, the second amplifier is configured to generate the output voltage to depend on the input offset voltage according to a second polarity opposite the first polarity. Also, the first amplifier is configured to, during the second time period, generate the first comparison voltage in response to a first sum input voltage dependent on the first differential voltage and the output voltage dependent on the input offset voltage according to the second polarity.

In some embodiments, the storage circuitry includes a charge-storing circuit, and during the pre-charge phase, a switch, connected in parallel with the charge-storing circuit, is configured to turn on to bias the bit line and to set a third differential voltage of the charge-storing circuit to an initial voltage level.

In some embodiments, during the sense phase, the switch is configured to turn off; and in response to the switch turning off, the charge-storing circuit is configured to draw current and change the third differential voltage by a sense voltage amount indicative of current flow through the second charge-storing circuit during the second period.

In some embodiments, the circuit further includes a charge-storing circuit, and a reference bit line coupled to the charge-storing circuit. During the sense phase, the charge-storing circuit and the reference bit line are configured to draw a current. In addition, the charge-storing circuit is configured to change a third differential voltage by a sense voltage amount based on the current drawn during the second time period. Also, the amplifier is configured to generate the second comparison voltage in response to the second sum input voltage based on the sense voltage amount.

In another embodiment, a system includes a memory cell, a bit line connected to the memory cell, a reference bit line, a first amplifier, a second amplifier, a third amplifier, and a comparator. The first amplifier is configured to: bias the bit line with a bit line bias voltage; during a pre-charge phase of a sense operation, set a first differential voltage of a first charge-charge storing circuit to depend on a first input offset voltage of the first amplifier; and during a sense phase of the sense operation, generate a first output voltage dependent on a first sense voltage amount and the first input offset voltage, wherein the first sense voltage amount is indicative of a first current drawn through the bit line. The second amplifier is configured to bias the bit line with a bit line bias voltage, during a pre-charge phase of the sense operation, set a second differential voltage of a second charge-storing circuit to depend on a second input offset voltage of the second amplifier, and during a sense phase of the sense operation, generate a second output voltage dependent on a second sense voltage amount and the second input offset voltage, wherein the second sense voltage amount is indicative of a second current drawn through the bit line. The third amplifier is configured to, during the sense phase: generate a first comparison voltage dependent on the first differential voltage and the first output voltage, and generate a second comparison voltage dependent on the second differential voltage and the second output voltage. The comparator is configured to compare the first comparison voltage and the second comparison voltage, and in response to the comparison, generate an output signal indicative of a behavior of the memory cell in response to being biased during the sense operation.

In some embodiments, during the sense phase, a third charge-storing circuit is configured to draw the first current to increase a third differential voltage by the first sense voltage amount, and the fourth charge-storing circuit is configured to draw the second current to increase a fourth differential voltage by the second sense voltage amount.

In some embodiments, between the pre-charge phase and the sense phase, the first amplifier and the third charge-storing circuit are configured to maintain the bit line bias voltage at a constant level, and the second amplifier and the fourth charge-storing circuit are configured to maintain the reference bit line bias voltage at a constant level.

In some embodiments, during the pre-charge phase, the first amplifier and the second amplifier are configured as unity gain amplifiers.

In some embodiments, the third amplifier is configured to, during the pre-charge phase, set the first differential voltage to further depend on a third input offset voltage of the third amplifier according to a first polarity, and during the sense phase, generate the first comparison voltage to further depend on the third input offset voltage according to a second polarity opposite the first polarity.

Other embodiments are possible, and each of the embodiments can be used alone or together in combination. Accordingly, various embodiments will now be described with reference to the attached drawings.

Embodiments

The following embodiments describe apparatuses, devices, systems, and methods for performing sense operations with a sense circuit. The sense circuit may be configured to set and maintain voltages at certain levels during pre-charge and sense phases of the sense operation in order to cancel out or minimize non-idealities in the sense circuit while it is performing a sense operation. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
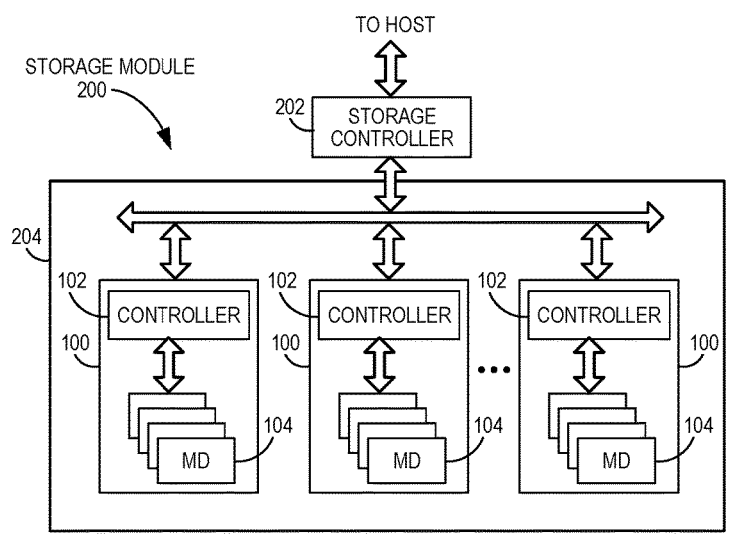
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
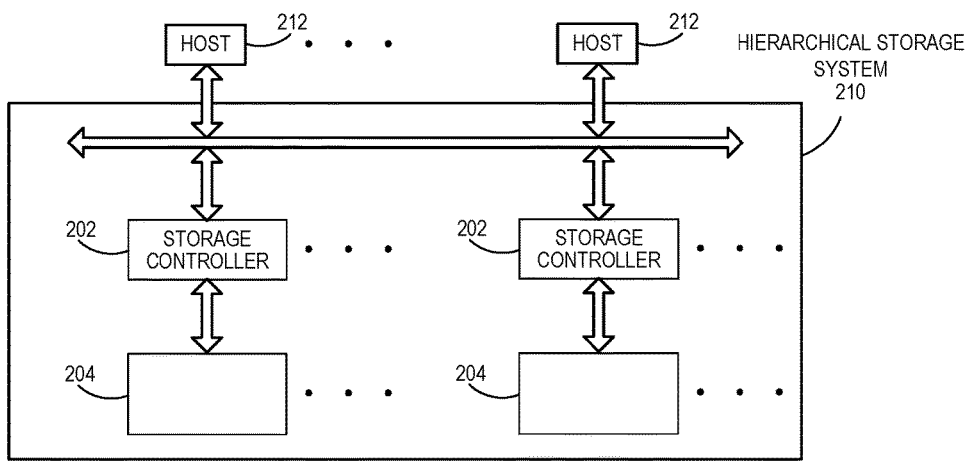
FIG. 1C is a block diagram of a hierarchical storage system.

FIG. 1C is a block diagram illustrating a hierarchical storage system 210. The hierarchical storage system 210 may include a plurality of storage controllers 202, each of which controls a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
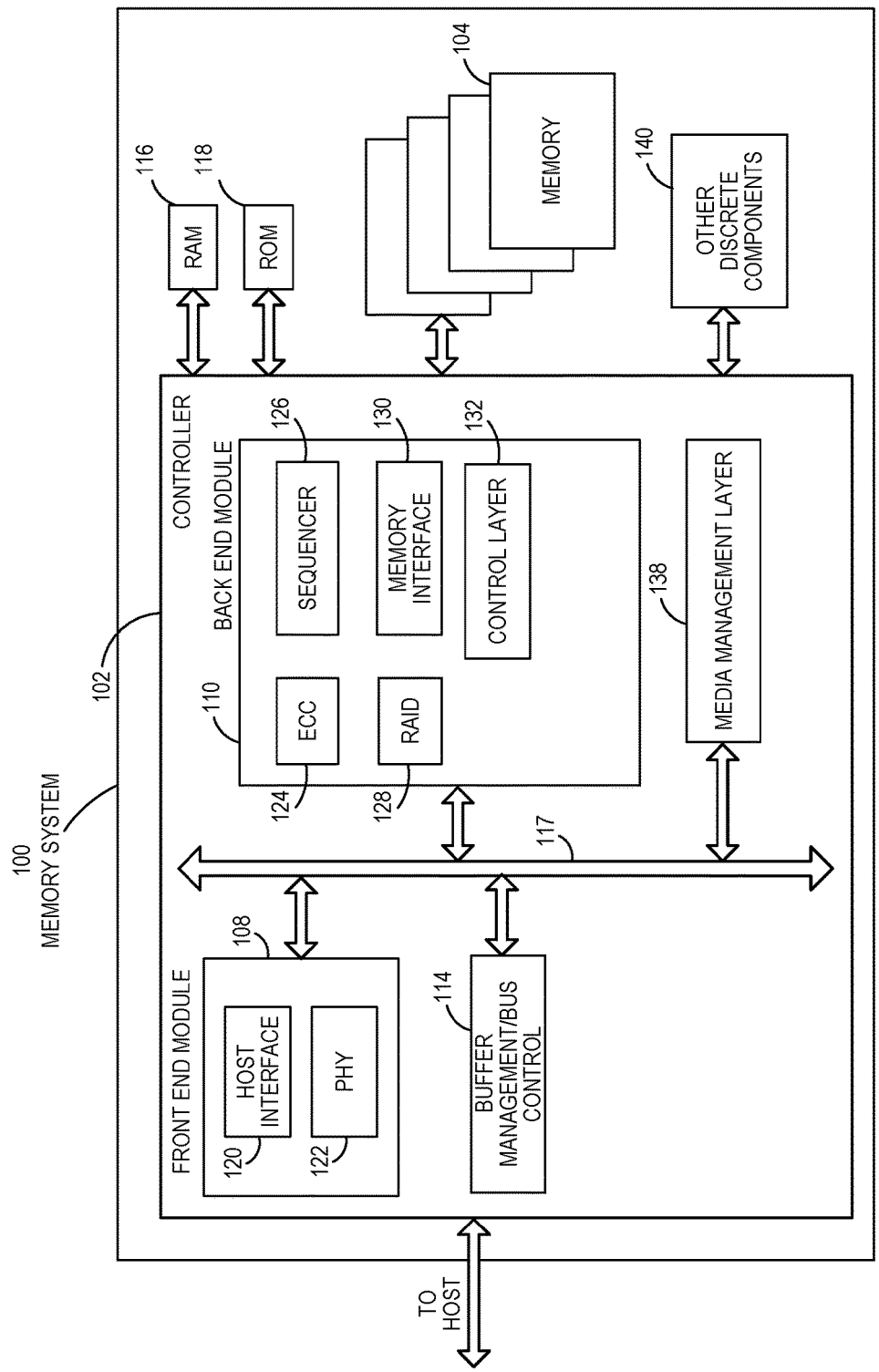
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
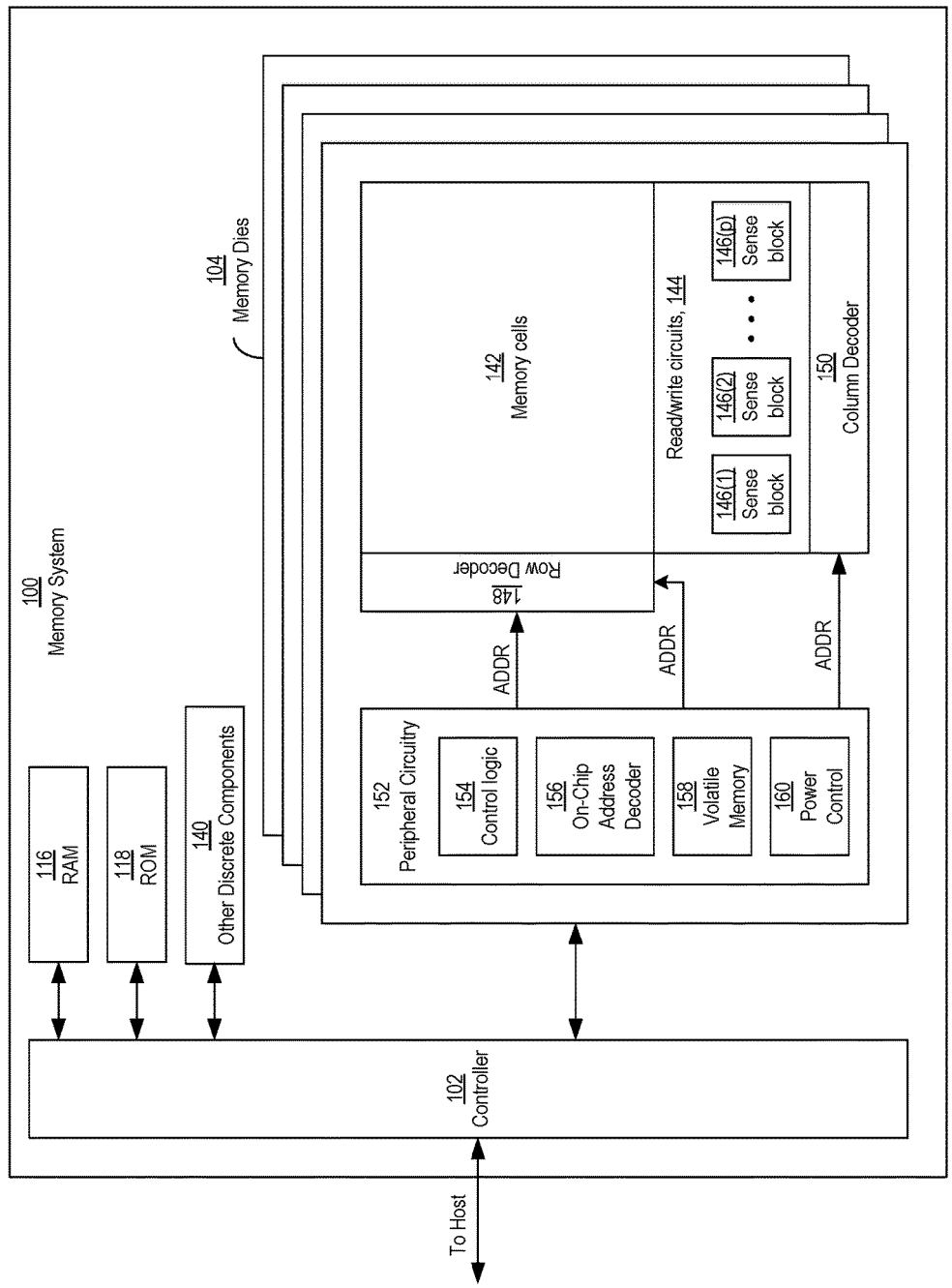
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include read/write circuits 144 that includes a plurality or p-number of sense blocks (also referred to as sense modules or sense circuits) 146. As described in further detail below, the sense blocks 146 are configured to participate in reading or programming the memory cells.

The memory die 104 may also include a row address decoder 148 and a column address decoder 150. The row address decoder 148 may decode a row address and select a particular word line when reading or writing data to/from the memory cells. The column address decoder 150 may decode a column address to select a particular group of bit lines in the memory cell structure 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including read voltages, program voltages (including program voltage pulses) to the wordlines, erase voltages (including erase voltage pulses), as well as other voltages that may be supplied to the word lines and bit lines of the memory cell structure 142, the read/write circuits 144, including the sense blocks 146, and/or other circuit components on the memory die 104. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations. For clarity, and unless otherwise specified, the combination of the power control circuitry 160, the read/write circuitry 144, and the sense blocks 146 used to bias word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof. The voltage supply circuitry may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible.

In some example configurations of the memory system 100, a memory die 104 may perform a verify operation to verify that data has been sufficiently programmed in memory cells. For the verify operations, the voltage supply circuitry may supply voltages to bias certain bit lines connected to target memory cells involved in the verify operation, and one or more sense blocks 146 may be configured to perform a sense operation to detect or sense for the amount of current flowing through the bit lines. Doing so may allow the sense block 146 or other circuitry on the memory die 104 to determine whether the target memory cells are sufficiently programmed.

Additionally, during a read operation to read data stored in target memory cells, the sense blocks 146 may be configured to perform sense operations to sense current flow through the bit lines connected to the target memory cells. The voltage supply circuitry may supply voltages on word lines and bit lines at appropriate levels that cause the target memory cells to draw or not to draw current through bit lines to which they are connected. For a given sense operation involving a memory cell connected to a bit line, the level or amount of current that a sense block 146 senses during a sense operation may identify the data value (e.g., a binary or logic value) of the data that the memory cell is storing.

Figure 3:
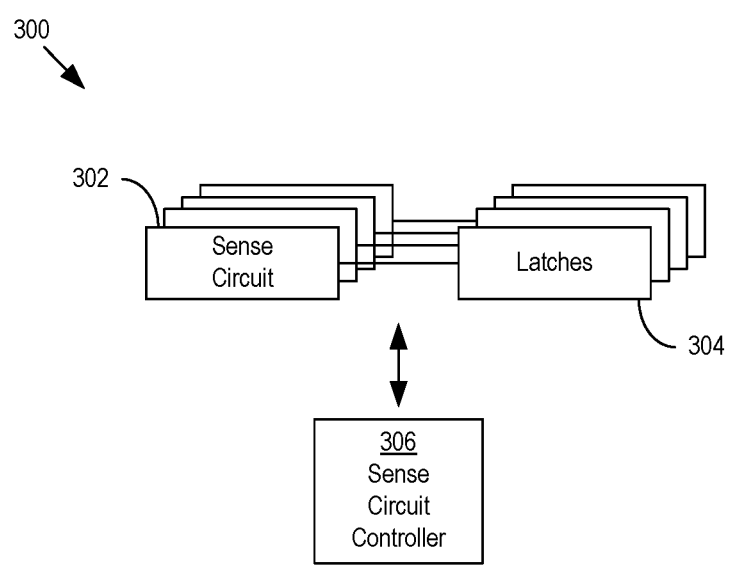
FIG. 3 is a block diagram of an example configuration of a sense block of FIG. 2B.

FIG. 3 is a block diagram of an example configuration of a sense block 300, which may be representative of one of the sense blocks 146(1) to 146(p) of FIG. 2B. The sense block 300 may include a plurality of sense circuits 302 and a plurality of latches 304. Each sense circuit (also referred to as a sense amplifier circuit) 302 may be associated with a respective one of the latches 304. That is, each sense circuit 302 may be configured to communicate with and/or perform a sense operation using data and/or storing data into its associated latches 304.

Additionally, the sense block 300 may include a sense circuit controller 306 that is configured to control operation of the sense circuits 302 and the latches 304 of the sense block 300. As described in further detail below, the sense circuit controller 106 may control operation of the sense circuits 302 and the latches 304 by outputting control signals to terminals of the sense circuits 302 and the latches 304. Additionally, the sense circuit controller 306 may communicate with and/or may be a part of the control logic 154. The sense circuit controller 306 may be implemented in hardware, or a combination of hardware and software. For example, the sense circuit controller 306 may include a processor that executes computer instructions stored in memory to perform at least some of its functions.

Figure 4A:
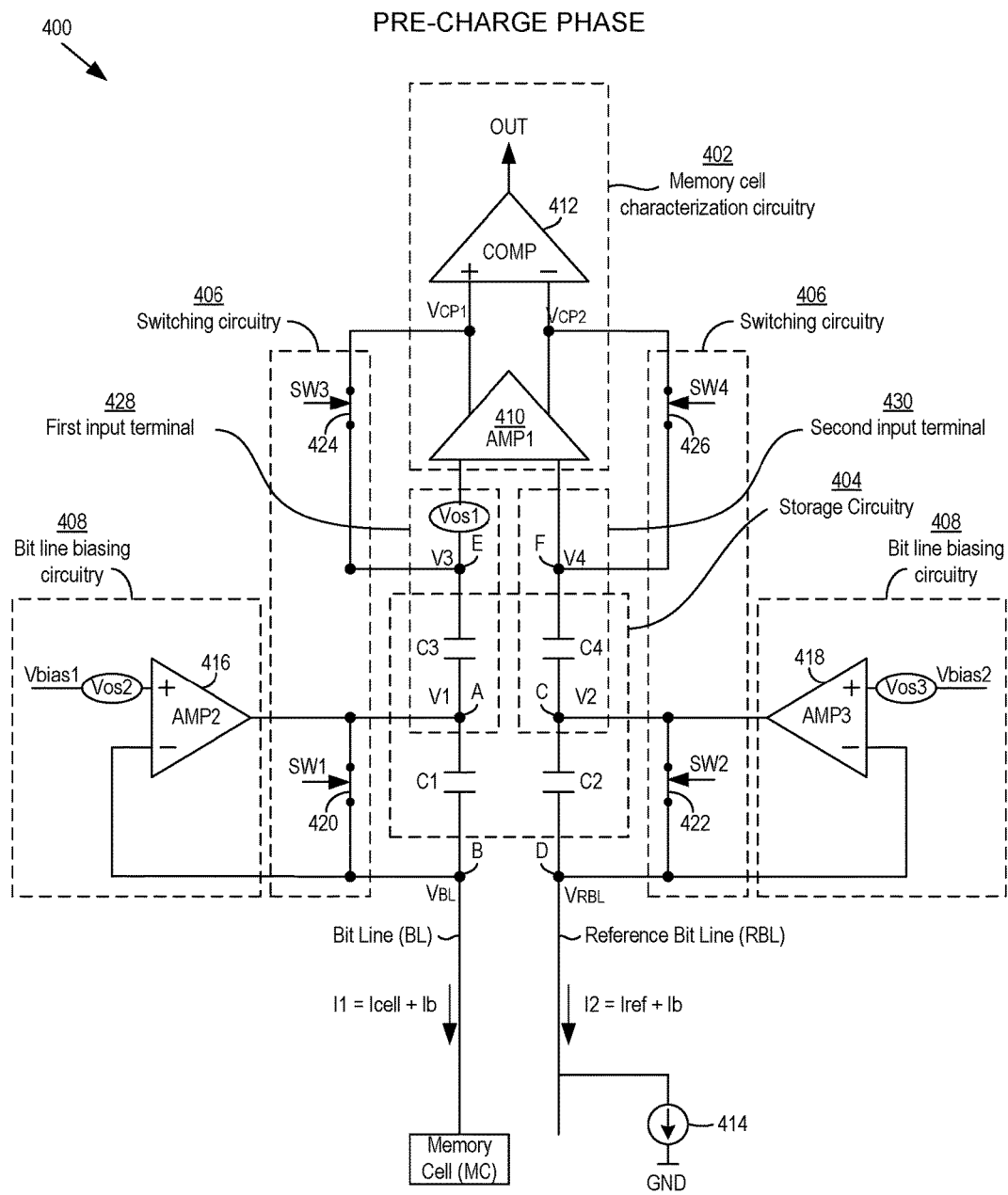
FIG. 4A is a partial circuit schematic diagram of an example sense circuit configured in a pre-charge phase.

The following description with reference to FIGS. 4A and 4A describes a sense circuit that may be used for the sense circuits 302 of FIG. 3 and/or for sense circuits configured in the sense blocks 146 of FIG. 2B. The sense circuit may be configured to perform a sense operation to identify a characterization of a memory cell connected to a bit line to which the sense circuit is coupled. The sense circuit may be configured to perform the sense operation over two time periods or two phases, including a pre-charge phase performed during a first time period and a sense phase performed during a second time period. During these time periods, the components of the sense circuit are configured to set and maintain voltages at certain levels that allow a first amplifier to generate output voltages at levels dependent on current flow through the bit line and a reference bit line during the sense phase, while isolated from and/or with minimized dependency on certain non-idealities in the sense circuit, including input offset voltages and background noise current generated on the bit line. Upon completion of or at the end of the sense phase, a comparator may compare the levels of the output voltages to determine a characterization of a memory cell.

In further detail, during the pre-charge phase, the first amplifier of the sense circuit is configured to set a first input voltage to a predetermined voltage level adjusted or offset by an input offset voltage of the first amplifier, and to set a second input voltage to the predetermined voltage level. In addition, as described in further detail below, the predetermined voltage level may be a direct current (DC) operating point input voltage of the first amplifier. Also, the first amplifier may adjust or offset the predetermined voltage level by the input offset voltage according to a first polarity.

By setting the first input voltage to the predetermined voltage level adjusted by the input offset voltage according to the first polarity, the first amplifier sets, or is at least part of a set of components of the sense circuit that sets, a first differential voltage across a first charge-storing circuit, such as a capacitor, to a differential voltage level dependent on the predetermined voltage level adjusted by the input offset voltage according to the first polarity. In addition, by setting the second input voltage to the predetermined voltage level, the first amplifier sets, or is at least part of a set of components of the sense circuit that sets, a second differential voltage across a second charge-storing circuit to a differential voltage level dependent on the predetermined voltage level.

The first and second charge-storing circuits are components of storage circuitry that is configured to maintain their respective differential voltages at constant levels during the sense phase. Additionally, during the sense phase, the first amplifier is configured to generate a first output voltage in response to a first sum input voltage and a second output voltage in response to a second sum input voltage. The first sum input voltage is dependent on the first differential voltage maintained by the first charge-storing circuit, and the second sum voltage is dependent on the second differential voltage maintained by the second charge-storing circuit. The first sum voltage is further dependent on the input offset voltage according to a second polarity that is opposite the first polarity. The first and second polarities being opposite means that if the first polarity refers to the input offset voltage as a subtractive component, then the second polarity refers to the input offset voltage as an additive component, or vice versa. By generating the first output voltage in response to a first sum input voltage dependent on the input offset voltage as both an additive component and a subtractive component, the first amplifier is configured to cancel out or minimize its input offset voltage when generating its output voltages.

The first amplifier's output voltages may be used as comparison voltages to determine a characterization of the memory cell. Accordingly, the first amplifier may generate its output voltages at levels that can be used to determine the characteristic of the memory cell without those levels being negatively affected by the input offset voltage of the first amplifier.

Additionally, the sense circuitry may include switching circuitry that is configured to connect a first output terminal of the first amplifier to a node of a first input terminal of the first amplifier, and to connect a second output terminal of the first amplifier to a node of a second input terminal of the first amplifier. During the pre-charge phase, switches of the switching circuitry may turn on to connect the output terminals to the input terminal nodes. In response, the first amplifier may set its first input voltage to the predetermined voltage level adjusted or offset by its input offset voltage according to the first polarity and set its second input voltage to the predetermined voltage level. Otherwise stated, turning on the switches to connect the output terminals to the input terminals may set a voltage difference between the first and second input terminals to be the input offset voltage according to the first polarity.

During the sense phase, the switches of the switching circuitry may disconnect the first output terminal from the node of the first input terminal and the second output terminal from the node of the second input terminal. In response to the disconnection during the sense phase, the first amplifier may be configured to generate its first and second output voltages based on the first sum voltage and the second sum voltage, which in turn, are respectively based on the first and second differential voltages maintained by the storage circuitry during the sense phase. As described, this dependency on the differential voltages maintained or stored by the charge-storing circuits allows the first amplifier to cancel out its input offset voltage while generating its output voltages during the sense phase.

The sense circuit may further include bit line biasing circuitry configured to bias the bit line with a bit line bias voltage, and to bias the reference bit line with a reference bit line bias voltage. In particular, the bit line biasing circuitry may include a second amplifier configured to bias the bit line with the bit line bias voltage and a third amplifier configured to bias the reference bit line with a reference bit line bias voltage. The second amplifier and the third amplifier may each have an input offset voltage. The input offset voltage of the second amplifier is referred to as a second input offset voltage, and the input offset voltage of the third amplifier is referred to as a third input offset voltage.

The second amplifier may be configured to generate an output voltage dependent on the second input offset voltage according to a first polarity during both the pre-charge phase and the sense phase. In doing so, during the pre-charge phase, the second amplifier may set the first differential voltage of the first charge-storing circuit to depend on the second input offset voltage according to a second polarity opposite the first polarity. During the sense phase, the first charge-storing circuit's maintenance of the first differential voltage at a voltage level dependent on the second amplifier's input offset voltage according to the second polarity, and the second amplifier's generation of its output voltage at a level dependent on its input offset voltage according to the first polarity may negate or minimize the first amplifier's dependency on the second amplifier's input offset voltage when generating its output voltages. In other words, the sense circuit includes a second amplifier with an input offset voltage to bias the bit line, and the storage circuitry offsets that input offset voltage so that the comparator can determine the characterization of the memory cell without being influenced by the input offset voltage of the second amplifier.

Similarly, the third amplifier may be configured to generate an output voltage dependent on its input offset voltage according to a first polarity during both the pre-charge phase and the sense phase. In doing so, during the pre-charge phase, the third amplifier may set the second differential voltage of the second charge-storing circuit to depend on the third input offset voltage of the third amplifier according to a second polarity opposite the first polarity. During the sense phase, the second charge-storing circuit's maintenance of the second differential voltage at a level dependent on the third amplifier's input offset voltage according to the second polarity, and the third amplifier's generation of its output voltage at a level dependent on its input offset voltage according to the first polarity may negate or minimize the first amplifier's dependency on the third amplifier's input offset voltage when generating its output voltages. In other words, the sense circuit includes a third amplifier with an input offset voltage to bias the reference bit line, and the storage circuitry offsets that input offset voltage so that the comparator can determine the characterization of the memory cell without being influenced by the input offset voltage of the third amplifier.

The storage circuitry also includes a third charge-storing circuit and a fourth charge-storing circuit, and the switching circuitry includes a first switch connected in parallel with the third charge-storing circuit and a second switch connected in parallel with the fourth charge-storing circuit. During the pre-charge phase, the first and second switches turn on. In response, the second amplifier generates its output voltage at both terminals of the third-charge storing circuit and the third amplifier generates its output voltage at both terminals of the fourth charge-storing circuit, causing the third-charge storing circuit and the fourth charge-storing circuit to respectively maintain a third differential voltage and a fourth differential voltage at an initial voltage level of 0 volts (V). Also, in response to the first and second switches turning on, the second amplifier biases the bit line with a bit line bias voltage and third amplifier bias the reference bit line with a reference bit line bias voltage. The voltage levels of the bit line bias voltage and the reference bit line bias voltage may both be and/or correspond to the output voltage level of the second amplifier and the third amplifier, respectively.

In transitioning between the pre-charge phase and the sense phase, the first and second switches switch from being turned on to being turned off. In response to first switch turning off—that is as the sense operation transitions from the pre-charge phase to the sense phase—the second amplifier and the third charge-storing circuit may operate to maintain the voltage level of bit line bias voltage at a constant level. Similarly, in response to the second switch turning off—that is as the sense operation transitions from the pre-charge phase to the sense phase—the third amplifier and the fourth charge-storing circuit may operate to maintain the voltage level of the reference bit line bias voltage at a constant level. In other words, the pre-charge voltage level and the sense voltage level of the bit line bias voltage and the reference bit line bias voltage may be the same, which avoids resettling time between the pre-charge and sense phases, as described in further detail below.

During the sense phase, the memory cell may sink a first current through the bit line in response to the bit line being biased with the bit line bias voltage. The second amplifier may source the first current. Since the first switch is turned off, the first current may flow through the third charge-storing circuit into the bit line. During the sense phase, the second amplifier may still generate its output voltage at a level that depends on its input offset voltage according to the first polarity. Additionally, the flow of the first current through the third charge-storing circuit may cause the third charge storage circuit to increase the third differential voltage by a first sense voltage amount indicative of the flow of the first current flow through the bit line during the sense phase. Accordingly, during the sense phase, the second amplifier may generate its output voltage at a voltage level dependent on the first sense voltage amount and the input offset voltage of the second amplifier.

In a similar manner, during the sense phase, a reference current source may sink a second current through the reference bit line. The third amplifier may source the second current. Since the second switch is turned off, the second current may flow through the fourth charge-storing circuit into the reference bit line. During the sense phase, the third amplifier may still generate its output voltage at a level that depends on its input offset voltage according to the first polarity. Additionally, the flow of the second current through the fourth charge-storing circuit may cause the fourth charge storage circuit to increase the fourth differential voltage by a second sense voltage amount indicative of the flow of the second current flow through the reference bit line during the sense phase. Accordingly, during the sense phase, the third amplifier may generate its output voltage at a voltage level dependent on the second sense voltage amount and the input offset voltage of the third amplifier.

As mentioned, during the sense phase, the first amplifier is configured to generate a first output voltage in response to a first sum input voltage and a second output voltage in response to a second sum input voltage. The first sum voltage may further depend on the output voltage of the second amplifier, and in turn the first sense voltage amount and/or the amount of the first current in the bit line during the sense phase. Similarly, the second sum voltage may further depend on the output voltage of the third amplifier, and in turn the second sense voltage amount and/or the amount of the second current in the reference bit line during the sense phase.

As described in further detail below, the amount of the first current in the bit line relative to the second current in the reference bit line during the sense phase may indicate a characterization of the memory cell. Accordingly, upon completion or at the end of the sense phase, the comparator may compare the output voltages of the first amplifier, and the comparison may indicate a characterization of the memory cell. In response to the comparison, the comparator may generate and output an output signal at a level indicative of the comparison, and in turn indicative of the characterization of the memory cell.

Through the setting and maintenance of the voltages during the pre-charge and sense phases as described, the first amplifier may generate its output voltages dependent on a cancellation of the input offset voltages of the first, second, and third amplifiers so that they do not, or at least minimally, affect the indication of the memory cell characterization that the output voltages of the first amplifier provide to the comparator. Additionally, the reference bit line may mimic or mirror the behavior of the bit line, and so any background noise current generated on the bit line may be similarly generated on the reference bit line. This may allow the comparator to cancel out or at least minimize the impact that the background noise current has on the output voltages of the first amplifier when performing the comparison.

Further details of the sense circuit are now described with reference to a partial circuit schematic of an example sense circuit 400 shown in FIGS. 4A and 4B. The example sense circuit 400 may be representative of one of the sense circuits 302 of the sense block 300 of FIG. 3, and/or included in one of the sense blocks 146 of FIG. 2B. As described in further detail below, the sense circuit 400 is configured to perform a sense operation in two phases, including a pre-charge phase and a sense phase. FIG. 4A shows sense circuit 400 configured for operation in the pre-charge phase, and FIG. 4B shows the sense circuit 400 configured for operation in the sense phase.

Figure 4B:
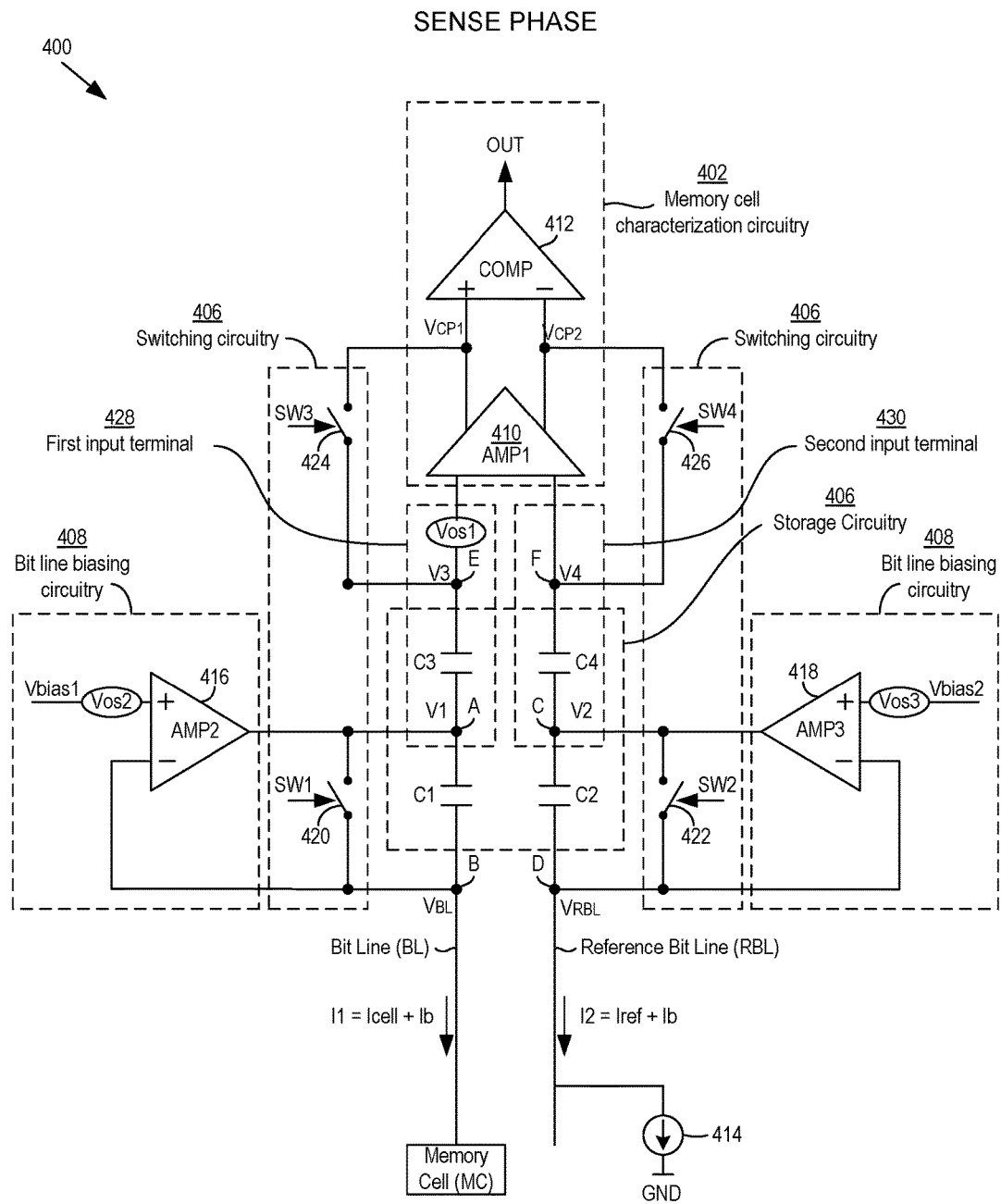
FIG. 4B is a partial circuit schematic diagram of the example sense circuit of FIG. 4A configured in a sense phase.

Additionally, FIGS. 4A and 4B show the sense circuit 400 coupled to and configured to sense an amount of a cell current Icell drawn through an associated bit line BL connected to a memory cell MC. The associated bit line BL may be one of the plurality of bit lines and the memory cell may be one of the plurality of memory cells of the memory cell structure 142 located on the memory die 104 on which the sense circuit 400 is located.

The sense circuit 400 may be configured to sense the amount of the cell current Icell as part of a memory operation associated with the memory cell MC, such as a read operation to read data that the memory cell MC is storing or a verify operation to verify that data is sufficiently programmed in the memory cell MC. Based on the current sensing that the sense circuit 400 performs, the sense circuit 400 may generate and output a sense circuit output signal OUT that indicates a characterization of the memory cell MC that characterizes or conveys information about of the state of the memory cell MC for which the sense operation is performed.

As examples, in situations where the sense circuit 400 performs a sense operation as part of a read operation, the state of the memory cell may correspond to the data value of the data it is storing, and the characterization may include an indication of the data value that the memory cell MC is storing and/or a state of the memory cell MC that corresponds to that data value. Accordingly, the level of the output signal OUT may indicate the data value (e.g., a binary value) of data that the memory cell MC is storing. As another example, the characterization may include an indication of whether a threshold voltage $V_{TH}$ is above or below a certain read voltage level and/or a state of the memory cell that corresponds to that threshold voltage $V_{TH}$. Accordingly, the level of the output signal OUT may indicate whether the threshold voltage $V_{TH}$ of the memory cell MC is above or below a certain read reference voltage level Vr. As another example, in a situation where the sense circuit 400 performs the sense operation as a verify operation, characterization may include an indication of whether the memory cell is sufficient programmed to its assigned state and/or an indication of the state of the memory cell MC corresponding to whether or not it is sufficiently programmed. Accordingly, the level of the output signal OUT may indicate whether the memory cell MC is sufficiently programmed to its assigned memory state, or whether another program operation is needed to sufficiently program the memory cell MC.

In addition or alternatively, the characterization may characterize how the memory cell MC behaves or responds and/or a behavior of the memory cell MC in response to being biased according to certain biasing conditions during the sense operation. The biasing may include the sense circuit 400 biasing the bit line BL with a bit line bias voltage, which in turn biases the memory cell MC. Other or additional biasing may include biasing a word line connected to the memory cell MC with a word line voltage at a certain voltage level, such as a certain read voltage level or a certain verify voltage level. The memory cell MC may behave or respond differently to a certain biasing condition depending on its state. That is, memory cells in different states may respond differently to the same set of biasing conditions. One way a memory cell MC responds or behaves differently is by drawing different amounts of current through the bit line BL. In other words, the characterization identified during the sense operation characterizes or indicates a behavior of the memory cell in response to being biased during the sense operation, which in turn indicates the state of the memory cell, which in turn indicates certain information for which the sense operation is performed, such as the data value that the memory cell MC is storing, whether the memory cell MC has a threshold voltage $V_{TH}$ above or below a certain read voltage level, or whether the memory cell MC is sufficiently programmed.

The example sense circuit 400 may include memory cell characterization circuitry 402, storage circuitry 404, switching circuitry 406, and bit line bias circuitry 408.

The memory cell characterization circuit 402 is configured to generate the output signal OUT indicating a characterization of the memory cell MC. In the example configuration shown in FIGS. 4A and 4B, the memory cell characterization circuit 402 includes a first amplifier (AMP1) 410 and a comparator (COMP) 412. The first amplifier 410 may be configured to generate and output a pair of comparison voltages, including a first comparison voltage $V_{CP1}$ and a second comparison voltage $V_{CP2}$, at a pair of output terminals. For example, the first amplifier 410 may be configured to generate the first comparison voltage $V_{CP1}$ at a first output terminal of the pair and the second comparison voltage $V_{CP2}$ at a second output terminal of the pair.

The comparator 412 may include a pair of input terminals connected to the pair of output terminals of the first amplifier 410, and be configured to receive the pair of comparison voltages $V_{CP1}$, $V_{CP2}$ as its input voltages. As described in further detail below, the sense circuit 400 is configured to generate the first comparison voltage $V_{CP1}$ based on the cell current Icell drawn through the bit line BL. At the end of a sense phase, the comparator 412 is configured to compare the voltage levels of the comparison voltages $V_{CP1}$, $V_{CP2}$ and output the output signal OUT at a level indicative of the comparison. That is, at the end of the sense phase, the relative voltage levels of the comparison voltages $V_{CP1}$, $V_{CP2}$ may indicate an amount of the cell current Icell drawn through the memory cell MC, and in turn a characterization of the memory cell MC. The comparator 412 may compare the voltage levels of the comparison voltages $V_{CP1}$, $V_{CP2}$ to identify or sense the amount of the cell current Icell drawn through the memory cell MC and/or the characterization of the memory cell MC, and in response, output the output signal OUT at a level indicative of the comparison and/or the characterization.

The first amplifier 410 may have a first input offset voltage Vos1. In general, an input offset voltage is a parameter defining the differential direct current (DC) voltage between the inputs of an amplifier that causes the output of the amplifier to be 0 Volts (V), either between a single-ended output terminal of the amplifier and a ground reference, or between two output terminals of the amplifier. Ideally, the offset voltage is 0 V. However, in actual implementation, due to process imperfections in manufacturing amplifiers, the input offset voltage parameter of an amplifier is typically a non-zero voltage value. With respect to the first amplifier 410, the first input offset voltage Vos1 can cause the first amplifier 410 to output the comparison voltages $V_{SP1}$, $V_{CP2}$ at relative voltage levels that are not directly proportional to only the difference of the input voltage levels, but instead at voltage levels that are further based on the first off set voltage Vos1. This could lead to a comparison that inaccurately indicates a characterization of the memory cell MC. As described in further detail below, during the sense phase, the first amplifier 410 is configured to generate the comparison voltages $V_{CP1}$, $V_{CP2}$ in a way that aims to cancel out the first input offset voltage Vos1 in order to minimize its influence on the comparison performed by the comparator 412 at the end of the sense phase. Doing so allows the comparator 412 to output the output signal OUT at a level that accurately indicates the characterization of the memory cell MC.

As indicated in FIGS. 4A and 4B, the bit line BL may be configured to draw a first total current I1 dependent on the cell current Icell and a background noise current Ib. The cell current Icell is the portion of the first total current I1 that the memory cell MC causes to be drawn through the bit line BL. The background noise current Ib is a portion of the first total current I1 caused by one or more background noise sources. An example background noise source may be a nearby power supply on the memory die 104, although other background noise sources are possible.

A difference in relatively small amounts of the cell current Icell, such as on the order of nanoAmps (nA) for example, may indicate different characterizations of the memory cell MC. Consequently, a large enough amount of the background noise current Ib could cause the comparator 412 to identify an incorrect characterization of the memory cell MC.

In addition to being coupled to the bit line BL, the sense circuit 400 is also coupled to a reference bit line RBL. As shown in FIGS. 4A and 4B, the reference bit line RBL is coupled to a reference current source 414 that is configured to draw a reference current Iref through the reference bit line RBL. As described in further detail below, the reference current Iref is used by the sense circuit 400 to generate the second comparison voltage $V_{CP2}$.

In addition to being used to generate the second comparison voltage $V_{CP2}$, the reference bit line RBL may be used to cancel out the background noise current Ib in order to minimize its influence in indicating the characteristic of the memory cell MC. That is, similar to the bit line's BL drawing of the first total current I1, the reference bit line RBL may be configured to draw a second total current I2 equal to the reference current Iref and the background noise current Ib. The background current Ib drawn through each of the bit line BL and reference bit line RBL may be relatively the same or contribute the same amount of current to each of the first and second total currents I1, I2, which in turn may cause the voltage levels of the comparison voltages $V_{CP1}$, $V_{CP2}$ to both be based on the same background noise current Ib. In turn, the comparator 412 may effectively cancel out or minimize the contribution of the background noise current Ib in the sense circuit 500 when comparing the voltage levels of the comparison voltages $V_{CP1}$, $V_{CP2}$. This way, the comparison that the comparator 412 performs can be based on the amount of the cell current Icell relative to the amount of the reference current Iref without any, or at least with minimal influence, from the background noise current Ib on the bit line BL. In some example configurations, the reference bit line RBL physically extends along with and/or substantially parallel to the bit line BL in order to exhibit or mimic similarly behavior of the bit line BL, such as by drawing the same or similarly background noise current Ib.

The storage circuitry 404 is configured to maintain or store a plurality of differential voltages during the sense operation. As described in further detail below, the plurality of differential voltages is used to cancel out input offset voltages and provide indications of the amount of the cell current Icell and the reference current Iref flowing through the bit line BL and reference RBL.

In the example configuration shown in FIGS. 4A and 4B, the storage circuitry 404 includes a plurality of charge-storing circuits. Each charge-storing circuit includes a pair of ends or terminals. In addition, each charge-storing circuit is configured to generate a differential voltage across its pair of terminals based on and/or corresponding to the amount of charge the charge-storing circuit is storing. As used herein, a differential voltage across a pair of terminals of a charge-storing circuit is the voltage difference between a first voltage with respect to ground generated at a first terminal of the pair of terminals and a second voltage with respect to ground generated at a second terminal of the pair of terminals. An example charge-storing circuit is a capacitor, although other types of charge-storing circuits may be possible. The plurality of charge-storing circuits includes a first charge-storing circuit C1, a second charge-storing circuit C2, a third charge-storing circuit C3, and a fourth charge-storing circuit C4. For purposes of illustration, a capacitor symbol is used to represent each of the first, second, third, and fourth charge-storing circuits C1, C2, C3, C4.

The first charge-storing circuit C1 includes a first terminal connected to a node A where a first voltage V1 is generated, and a second terminal connected to a node B, which in turn is connected to the bit line BL. A bit line bias voltage $V_{BL}$ used to bias the bit line BL may be generated at node B.

The second charge-storing circuit C2 includes a first terminal connected to a node C where a second voltage V1 is generated, and a second terminal connected to a node D, which in turn is connected to the reference bit line RBL. A reference bit line bias voltage $V_{RBL}$ used to bias the reference bit line RBL may be generated at node D.

The third charge-storing circuit C3 includes a first terminal connected to a node E where a third voltage V3 is generated, and a second terminal connected to node A. In addition, the first terminal of the third charge-storing circuit C3 may connect to a first input of the first amplifier 410.

The fourth charge-storing circuit C4 includes a first terminal connected to a node F where a fourth voltage V4 is generated, and a second terminal connected to node C. In addition, the first terminal of the fourth charge-storing circuit C4 may connect to a second input of the first amplifier 410.

The bit line biasing circuitry 408 is configured to bias the bit line BL with the bit line voltage $V_{BL}$ and to bias the reference bit line RBL with the reference bit line voltage $V_{RBL}$. In the example configuration shown in FIGS. 4A and 4B, the bit line biasing circuitry 408 may include a second amplifier (AMP2) 416 configured to bias the bit line BL and a third amplifier (AMP3) 418 configured to bias the reference bit line RBL. The second and third amplifiers 416, 418 may each include two input terminals, including a positive input terminal and a negative input terminal, and an output terminal.

With respect to the second amplifier 416, a first positive input terminal may be configured to receive a first bias voltage Vbias1, such as from the voltage supply circuitry. The voltage level of the first bias voltage Vbias1 may depend on the memory operation for which the sense circuit 400 is performing the sense operation. For example, in the event that the sense circuit 400 is performing a sense operation as part of a read operation to read data from the memory cell MC, the voltage level of the first bias voltage Vbias1 may be a read voltage level VREAD that is used to bias selected bit lines for sense operations performed for read operations. As another example, in the event that the sense circuit 400 is performing a sense operation as part of a verify operation to verify that data is sufficient programmed in the memory cell MC, the voltage level of the first bias voltage Vbias may be a verify voltage level that is used to bias selected bit lines for sense operations performed for verify operations. Additionally, as shown in FIGS. 4A and 4B, the output terminal of the second amplifier 416 may be connected to node A where the first voltage V1 is generated. Also, a negative input terminal of the second amplifier 416 is connected to node B where the bit line bias voltage $V_{BL}$ is generated. The biasing of the bit line BL performed with the second amplifier 416 is described in further detail below.

With respect to the third amplifier 418, a first positive input terminal may be configured to receive a second bias voltage Vbias2, such as from the voltage supply circuitry 160 (FIG. 2B). In particular example configurations, the voltage level of the second bias voltage Vbias2 is set to be the same as the level of the first bias voltage Vbias1, and similarly depend on the memory operation for which the sense circuit 400 is performing the sense operation. Additionally, as shown in FIGS. 4A and 4B, the output terminal of the third amplifier 418 may be connected to node C where the second voltage V2 is generated. Also, a negative input terminal of the second amplifier 416 is connected to node D where the reference bit line bias voltage $V_{RBL}$ is generated. The biasing of the reference bit line BL performed with the third amplifier 418 is described in further detail below.

For some example configurations, the second and third amplifiers 416, 418 may each be an operational amplifier (op amp), such as operational transconductance amplifier (OTA). In addition or alternatively, the second and third amplifiers 416, 418 may be configured to have unity gain and/or configured as unity gain buffer, particularly during the pre-charge phase.

As mentioned, the sense circuit 400 is configured to perform a sense operation in two stages or phases and/or during two time periods in order to determine a characterization of the memory cell MC. The two phases include a pre-charge phase and a sense phase. At the end of the sense phase, the sense circuit 400 will generate the comparison voltages $V_{CP1}$, $V_{CP2}$ at respective voltage levels indicative of the levels or amounts of the cell current Icell and the reference current Iref that flowed through the respective bit line BL and reference bit line RBL during the time duration of the sense phase. The comparator 412 may then compare the voltage levels of the comparison voltages $V_{CP1}$, $V_{CP2}$ in order to determine the characterization of the memory cell MC.

The sense circuit controller 306 may be configured to control the sense circuit 400 to be in the pre-charge phase and the sense phase. The sense circuit controller 306 may do so through control of the switching circuitry 406, such as by configuring switches of the switching circuitry in on states and off states. As used herein, a switch, alternatively referred to as a switching circuit, is a circuit that is configurable in two states, including an on state and an off state. A switch may be configured to turn on to be configured in its on state and to turn off to be configured in its off state. In addition, a switch may be configured to have three terminals, including a first terminal, a second terminal, and a third terminal. The sense circuit controller 306 may configure a switch in the on state and the off state by applying a control signal (or switching signal) to its third terminal. When in the on state, the switch forms a short circuit or a path of relatively low resistance to effectively form a short between its first and second terminals. When in the off state, the switch forms a path of relatively high resistance between its first and second terminals to effectively form or be considered an open circuit between its first and second terminals. An example type of switch may be a transistor, such as a metal-oxide-semiconductor field-effect transistor (MOSFET). The source and drain terminals of the MOSFET may function as the first and second terminals, and the MOSFET may turn on and off in response to receipt of a gate bias voltage received at its gate terminal, which functions as the third terminal of the switch. Other types of switches may be possible.

In the example configuration shown in FIGS. 4A and 4B, the switching circuitry 406 may include a first switch 420, a second switch 422, a third switch 424, and a fourth switch 426. The first switch 422 is connected in parallel with the first charge-storing circuit C1, and includes a first terminal connected to node A and to the output terminal of the second amplifier 416, and a second terminal connected to node B and to the negative input terminal of the second amplifier 416. The sense circuit controller 306 may output a first control signal SW1 to configure the first switch 420 in the on state and the off state. When configured in the on state, the first switch 420 is configured to short together the output and negative input terminals of the second amplifier 416 and cause the first voltage V1 and the bit line bias voltage $V_{BL}$ to be at the same voltage level. Alternatively, in the off state, the first switch 420 effectively forms an open circuit, which allows the first voltage V1 and the bit line bias voltage $V_{BL}$ to be generated at different voltage levels based on current flow through the first charge-storing circuit C1.

In a similar manner, the second switch 422 is connected in parallel with the second charge-storing circuit C2, and includes a first terminal connected to node C and to the output terminal of the second amplifier 416, and a second terminal connected to node D and to the negative input terminal of the second amplifier 416. The sense circuit controller 306 may output a second control signal SW2 to configure the second switch 422 in the on state and the off state. When configured in the on state, the second switch 422 is configured to short together the output and negative input terminals of the third amplifier 418 and cause the second voltage V2 and the reference bit line bias voltage $V_{RBL}$ to be at the same voltage level. Alternatively, in the off state, the second switch 422 effectively forms an open circuit, which allows the second voltage V2 and the reference bit line bias voltage $V_{RBL}$ to be generated at different voltage levels based on current flow through the second charge-storing circuit C2.

The third switch 424 includes a first terminal connected to the first output terminal of the first amplifier 410 where the first comparison voltage $V_{CP1}$ is generated, and a second terminal connected to node E and the first terminal of the third charge-storing circuit C3 where the third voltage V3 is generated. The sense circuit controller 306 may output a third control signal SW3 to configure the third switch 424 in the on state and the off state. When configured in the on state, the third switch 424 is configured to short the first output terminal of the first amplifier 410 with node E and cause the first comparison voltage $V_{CP1}$ and the third voltage V3 to be set to the same voltage level. Alternatively, when configured in the off state, the third switch 424 is configured to form an open circuit between the first output terminal and node E. In response to the third switch 424 being turned off, the first amplifier 410 is configured to generate the first comparison voltage $V_{CP1}$ at a voltage level based on its input voltages independent of a path directly shorting or connecting the first output terminal and node E.

The fourth switch 426 includes a first terminal connected to the second output terminal of the first amplifier 410 where the second comparison voltage $V_{CP2}$ is generated, and a second terminal connected to node F and the first terminal of the fourth charge-storing circuit C4 where the fourth voltage V4 is generated. The sense circuit controller 306 may output a fourth control signal SW4 to configure the fourth switch 426 in the on state and the off state. When configured in the on state, the fourth switch 426 is configured to short the second output terminal of the first amplifier 410 with node F and cause the second comparison voltage $V_{CP2}$ and the fourth voltage V4 to be set to the same voltage level. Alternatively, when configured in the off state, the fourth switch 426 is configured to form an open circuit between the second output terminal and node F. In response to the fourth switch 426 being turned off, the first amplifier 410 is configured to generate the second comparison voltage $V_{CP2}$ at a voltage level based on its input voltages independent of a path directly shorting or connecting the second output terminal and node F.

Operation of the sense circuit 400 and the sense circuit controller 306 in the pre-charge and sense phases to perform a sense operation is now described. The pre-charge phase is described with reference to FIG. 4A, and is described as being performed over a first time period extending from a first or initial time t1 to a second time t2. The sense phase is described with reference to FIG. 4B, and is described as being performed immediately after the pre-charge phase ends and over a second time period extending from the second time t2 to a third time t3.

In general, the sense circuit 400 is configured to perform sense operations in a way that eliminates or minimizes the influence that input offset voltages in the sense circuit 400 have on determining a characteristic of the memory cell MC. Besides the first input offset voltage Vos1 of the first amplifier 410, additional input offset voltages in the sense circuit 400 include a second input offset voltage Vos2 of the second amplifier 416 and a third input offset voltage Vos3 of the third amplifier 418. Doing so can allow the sense circuit 400 to more accurately determine the characterization of the memory cell MC.

Referring particularly to FIG. 4A, in the pre-charge phase, the sense circuit 400 is configured to: (1) bias the bit line BL and the reference bit line RBL with their respective bias voltages $V_{BL}$, $V_{RBL}$ at bias voltage levels; (2) set a first differential voltage V(C1) of the first charge-storing circuit C1 and a second differential voltage V(C2) of the second charge-storing circuit C2 to initial voltage levels, such as 0 volts (V); and set a third differential voltage V(C3) of the third charge-storing circuit C3 and a fourth differential voltage of the fourth charge-storing circuit V(C4) to respective voltage levels that will allow the first amplifier 410 to cancel out input offset voltages Vos1, Vos2, Vos3 when generating the comparison voltages $V_{CP1}$, $V_{CP2}$ during the sense phase.

With respect to biasing the bit line BL, starting at the first time t1, the second amplifier 416 is configured to receive the first bias voltage Vbias1 at its positive input terminal, and generate the bit line bias voltage $V_{BL}$ at a bias voltage level that is based on the voltage level of the first bias voltage Vbias1. In a particular example configuration, during the pre-charge phase, the sense circuit controller 306 configures the second amplifier 416 as a unity gain amplifier (or a unity gain buffer), such as by outputting the first control signal SW1 to the first switch 420 to turn on the first switch 420. In response, the first switch 420 may short together the output terminal and the negative input terminal of the second amplifier 416, which configures the second amplifier 416 as a unity gain amplifier. As a unity gain amplifier, at least by the end of the pre-charge phase at the second time t2, the second amplifier 416 is configured to generate its output voltage at a voltage level equal to and/or dependent on the sum of the voltage level of the first bias voltage Vbias1 and the voltage level of the second input offset voltage Vos2, or (Vbias1+Vos2). With the bit line BL being connected to the sense circuit 400 at the negative input terminal (e.g., at node B), the second amplifier 416 sets the voltage level of the bit line bias voltage $V_{BL}$ to the voltage level of its output terminal and negative input terminal, which is (Vbias1+Vos2). The voltage level (Vbias1+Vos2) is referred to as the bit line bias voltage level.

Biasing the bit line BL with the bit line bias voltage $V_{BL}$ at the bit line bias voltage level may cause the memory cell MC to draw the first current I1 equal to the cell current Icell and the background current Ib. The second amplifier 416 may source the current that the memory cell MC draws. Accordingly, during the pre-charge phase with the first switch 420 turned on, the first current I1 may flow from the output of the second amplifier 416 through the first switch 420 into the bit line BL and to the memory cell MC.

With respect to biasing the reference bit line BL, starting at the first time t1, the third amplifier 418 is configured to receive the second bias voltage Vbias2 at its positive input terminal, and generate the reference bit line bias voltage $V_{RBL}$ at a bias voltage level that is based on the voltage level of the second bias voltage Vbias2. In a particular example configuration, the sense circuit controller 306 configures the third amplifier 416 as a unity gain amplifier (or a unity gain buffer), such as by outputting the second control signal SW2 to the second switch 422 to turn on the second switch 422. In response, the second switch 422 may short together the output terminal and the negative input terminal of the third amplifier 418, which configures the third amplifier 418 as a unity gain amplifier. As a unity gain amplifier, at least by the end of the pre-charge phase at the second time t2, the third amplifier 418 is configured to generate its output voltage at a voltage level equal to and/or dependent on the sum of the voltage level of the second bias voltage Vbias2 and the voltage level of the third input offset voltage Vos3, or (Vbias2+Vos3). With the reference bit line RBL being connected to the sense circuit 400 at the negative input terminal (e.g., at node D), the third amplifier 418 sets the voltage level of the reference bit line voltage $V_{RBL}$ to the voltage level of its output terminal and negative input terminal, which is (Vbias2+Vos3). The voltage level (Vbias2+Vos3) is referred to as the reference bit line bias voltage level.

The second amplifier 418 may source the current that the current source is sinking from the reference bit line RBL. Accordingly, during the pre-charge phase with the second switch 422 turned on, the second current I2 equal to the sum of the reference current Iref and the background current Ib may flow from the output of the third amplifier 418 through the second switch 422 into the reference bit line RBL and flow to the ground reference (GND) via the reference current source 414.

With respect to setting the first differential voltage V(C1) of the first charge-storing circuit C1 to an initial voltage level, with the sense circuit controller 306 turning on the first switch 420 to short together the output and negative input terminals of the second amplifier 420, the first voltage V1 may be at the same voltage level (Vbias1+Vos2) as the bit line bias voltage $V_{BL}$. As such, the initial voltage level of the first differential voltage V(C1) is 0 V. As described in further detail below, during the sense phase, the first current I1 may flow through the first charge-storing circuit C1 into the bit line BL, which may cause the first voltage V1, and in turn the first differential voltage V(C1), to increase. By setting the initial voltage level of the first differential voltage V(C1) to 0 V, the voltage level of the first differential voltage V(C1) at the end of the sense phase may be equal to the amount of voltage that first differential voltage V(C1) increased due to the flow of the first current I1 through the first charge-storing circuit C1 during the sense phase.

Similarly, with respect to setting the second differential voltage V(C1) of the second charge-storing circuit C2 to an initial voltage level, with the sense circuit controller 306 turning on the second switch 422 to short together the output and negative input terminals of the third amplifier 422, the second voltage V2 may be at the same voltage level (Vbias2+Vos3) as the reference bit line bias voltage $V_{RBL}$. As such, the initial voltage level of the second differential voltage V(C2) is 0 V. As described in further detail below, during the sense phase, the second current I2 may flow through the second charge-storing circuit C2 into the reference bit line RBL, which may cause the second voltage V2, and in turn the second differential voltage V(C1), to increase. By setting the initial voltage level of the second differential voltage V(C2) to 0 V, the voltage level of the second differential voltage V(C2) at the end of the sense phase may be equal to the amount of voltage that second differential voltage V(C2) increased due to the flow of the second current I2 through the second charge-storing circuit C2 during the sense phase.

With respect to setting the third differential voltage V(C3) to cancel out the second input offset voltage Vos2 during the sense phase, the second amplifier 416, configured as a unity gain amplifier with the first switch 420 turned on, may generate the first voltage V1 at a voltage level equal to the sum of the first bias voltage Vbias1 and the second input offset voltage Vos2, or (Vbias1+Vos2), as previously described. During the sense phase, the first amplifier 410 will generate the first comparison voltage $V_{CP1}$ based on the third differential voltage V(C3) of the third charge-storing circuit C3, which stores or maintains the second input offset voltage Vos2 as a subtractive component of a first sum input voltage to the first amplifier 410 during the sense phase. This subtractive component allows the first amplifier 410 to cancel out the second input offset voltage Vos2 when generating the first comparison voltage $V_{CP1}$. The cancellation of the second input offset voltage Vos2 during the sense phase is described in further detail below.

Similarly, with respect to setting the fourth differential voltage V(C4) to cancel out the third input offset voltage Vos3, the third amplifier 418, configured as a unity gain amplifier with the second switch 422 turned on, may generate the second voltage V2 at a voltage level equal to the sum of the second bias voltage Vbias2 and the third input offset voltage Vos3, or (Vbias2+Vos3), as previously described. During the sense phase, the first amplifier 410 will generate the second comparison voltage $V_{CP2}$ based on the fourth differential voltage V(C4) of the fourth charge-storing circuit C4, which stores the third input offset voltage Vos3 as a subtractive component of a second sum input voltage to the first amplifier 410. This subtractive component allows the first amplifier 410 to cancel out the third input offset voltage Vos3 when generating the second comparison voltage $V_{CP2}$. The cancellation of the third input offset voltage Vos3 during the sense phase is described in further detail below.

With respect to setting the third and fourth differential voltages V(C3), V(C4) to cancel out the first input offset voltage Vos1, the memory cell characterization circuit 402 is configured to set the voltage level of the third voltage V3 to a direct current (DC) operating point input voltage level $V_{DCOP}$ adjusted by the first input offset voltage Vos1 in the pre-charge phase. In particular, during the pre-charge phase, the memory cell characterization circuit 402 adjusts or offsets the voltage level of the third voltage V3 by the input offset voltage Vos1 in a direction or with a polarity that is opposite to the direction or polarity in which the memory cell characterization circuit 402 depends on the first offset voltage Vos1 to generate the first comparison voltage $V_{CP1}$ in the sense phase. As used herein, the DC operating point input voltage level $V_{DCOP}$ is the level of a DC voltage that the first amplifier 410 generates at its first and second inputs when operating in a DC stead-state operating condition and no alternating current (AC) input signals are applied to the first amplifier 410.

In a particular example configuration, during the pre-charge phase, the sense circuit controller 306 may output the third control signal SW3 to turn on the third switch 424, which causes the third switch 424 to short the first output terminal with its first input at node E where the third voltage V3 is generated. In turn, the first amplifier 410 may set the voltage level of the first comparison voltage $V_{CP1}$ and the voltage level of the third voltage V3 equal to each other. As a result, both the first comparison voltage $V_{CP1}$ and the third voltage V3 may be equal to the DC operating point input voltage level $V_{DCOP}$ minus the first offset voltage Vos1, or ($V_{DCOP}$−Vos1). As described in further detail below, the first amplifier 410 may be configured to depend on the first offset voltage Vos1 as an additive component when generating the first comparison voltage $V_{CP1}$ during the sense phase. As such, by the third switch 424 shorting the first output terminal with the first input of the first amplifier 410 at node E, the first amplifier 410 sets the voltage level of the third voltage V3 by subtracting the first input offset voltage Vos1 from the DC operating point input voltage level $V_{DCOP}$, or ($V_{DCOP}$−Vos1), so that the first amplifier 410 can cancel out the first input offset voltage Vos1, as an additive component, during the sense phase.

During the pre-charge phase, the sense circuit controller 306 may also output the fourth control signal SW4 to turn on the fourth switch 426, which causes the fourth switch 424 to short the second output terminal with its second input at node F where the fourth voltage V4 is generated. In turn, the first amplifier 410 may set the voltage level of the second comparison voltage $V_{CP2}$ and the voltage level of the fourth voltage V4 equal to each other. As a result, both the second comparison voltage $V_{CP2}$ and the fourth voltage V4 may be equal to the DC operating point input voltage $V_{DCOP}$. As described in further detail below, during the sense phase, because voltage levels of both the third voltage V3 and the fourth voltage V4 are dependent on the DC operating point input voltage level $V_{DCOP}$, the first amplifier 410 may cancel out the DC operating point input voltages when generating the first and second comparison voltages $V_{CP1}$, $V_{CP2}$ during the sense phase $V_{CP1}$.

In sum, during the pre-charge phase from the first time t1 to the second time t2, the sense circuit controller 306 is configured to output the control signals SW1, SW2, SW3, SW4 to respectively turn on the first switch 420, the second switch 422, the third switch 424, and the fourth switch 426. In response, the bit line bias circuitry 408 generates the bit line bias voltage $V_{BL}$ and the first voltage V1 to be the sum of first bias voltage Vbias1 and the second input offset voltage Vos2, or (Vbias1+Vos2), and generates the reference bit line voltage $V_{RBL}$ and the second voltage V2 to be the sum of the second bias Vbias2 and the third input offset voltage Vos3, or (Vbias2+Vos3). The generation of the bit line bias voltage $V_{BL}$ at the level (Vbias1+Vos2) may cause the memory cell MC to draw the first current through the bit line BL. Also, the second current I2 may flow through the reference bit line RBL. In addition, the memory cell characterization circuit 402 generates the third voltage V3 at the first input of the first amplifier 410 to be at the DC operating point input voltage level $V_{DCOP}$ minus the first input offset voltage Vos1, or ($V_{DCOP}$−Vos1), and generates the fourth voltage at the second input of the first amplifier 410 to be at the DC operating point input voltage level $V_{DCOP}$.

As a result of setting the first, second, third, and fourth voltages V1, V2, V3, and V4 during the pre-charge phase, the memory cell characterization circuit 402 and the bit line biasing circuitry 408 may set a pre-charge voltage level of the third differential voltage V(C3) to the voltage level of the third voltage V3 minus the voltage level of the first voltage V1, or (V3−V1)=($V_{DCOP}$−Vos1−Vbias1−Vos2), and may set a pre-charge voltage level of the fourth differential voltage V(C4) to the voltage level of the fourth voltage V4 minus the voltage level of the second voltage V2, or (V4−V2)= ($V_{DCOP}$−Vos1−Vbias2−Vos3).

Referring now to FIG. 4B, at the second time t2, the pre-charge phase may end and the sense phase may begin. In the sense phase, the first and second currents I1, I2 drawn through the respective bit line BL and the reference bit line RBL may respectively flow through the first and second charge-storing circuits C1, C2, which in turn may increase the first and second differential voltages V(C1), V(C2) by respective amounts indicative of the amounts of current flow. The first amplifier 410 generates the first and second comparison voltages $V_{CP1}$, $V_{CP2}$ in a way that aims to cancel out the non-idealities generated in the sense circuit 400, namely the input offset voltages Vos1, Vos2, Vos3, and the background current Ib. This way, the first amplifier 410 may generate the first and second comparison voltages $V_{CP1}$, $V_{CP2}$ at voltage levels that depend on the amount of current flow in the bit line BL and the reference bit line RBL, and with minimized influence from the non-idealities.

In further detail, at the start of the sense phase at the second time t2, the sense circuit controller 306 may output the first control signal SW1 to turn off the first switch 420. In response, the first current I1 output from the second amplifier 416 may flow through the first charge storing circuit C1, instead of through the first switch 420, to the bit line BL. The first current I1 may flow through the first charge-storing circuit C1 for the duration of the sense phase, from the second time t2 to the end of the sense phase at time t3. The flow of the first current I1 through the first charge-storing circuit C1 may cause the voltage level of the first voltage V1 at node A to increase. The amount that the first voltage V1 increases during the sense phase due to the first current I1 flowing through the first charge-storing circuit C1 is referred to as the first sense voltage amount $V_{S1}$. Accordingly, the voltage level of the first voltage V1 may increase from (Vbias1+Vos2) at the start of the sense phase to (Vbias1+Vos2+$V_{S1}$) by the end of the sense phase.

Additionally, during the sense phase, the second amplifier 416 may maintain the voltage level of the bit line bias voltage $V_{BL}$ at the pre-charge level (Vbias1+Vos2). Accordingly, by the end of the sense phase at the third time t3, the first differential voltage V(C1) may be equal to the first sense voltage amount $V_{S1}$.

Similarly, at the start of the sense phase at the second time t2, the sense circuit controller 306 may output the second control signal SW2 to turn off the second switch 422. In response, the second current I2 output from the third amplifier 418 may flow through the second charge storing circuit C2, instead of through the second switch 422, to the reference bit line RBL. The second current I2 may flow through the second charge-storing circuit C2 for the duration of the sense phase, from the second time t2 to the end of the sense phase at time t3. The flow of the second current I2 through the second charge-storing circuit C2 may cause the voltage level of the second voltage V2 at node C to increase. The amount that the second voltage V2 increases during the sense phase due to the second current I2 flowing through the second charge-storing circuit C2 is referred to as the second sense voltage amount $V_{S2}$. Accordingly, the voltage level of the second voltage V2 may increase from (Vbias2+Vos3) at the start of the sense phase to (Vbias2+Vos3+$V_{S2}$) by the end of the sense phase.

Additionally, during the sense phase, the third amplifier 418 may maintain the voltage level of the bit line bias voltage $V_{BL}$ at the pre-charge level (Vbias2+Vos3). Accordingly, by the end of the sense phase at the third time t3, the second differential voltage V(C2) may be equal to the second sense voltage amount $V_{S2}$.

In addition, during the sense phase, current may not flow through the third charge-storing circuit C3 or the fourth charge-storing circuit C4. For example, relatively high impedance of the first amplifier 410 may prevent current from flowing through the third and fourth charge-storing circuits C3, C4. As such, the third charge-storing circuit C3 and the fourth charge-storing circuit C4 may each maintain their respective differential voltages V(C3), V(C4) at their respective pre-charge voltage levels during the duration of the sense phase. That is, during the duration of the sense phase from the second time t2 to the third time t3, the third charge-storing circuit C3 may maintain its differential voltage V(C3) at its pre-charge voltage level of ($V_{DCOP}$−Vos1−Vbias1−Vos2), and the fourth charge-storing circuit C4 may maintain its differential voltage V(C4) at its pre-charge voltage level of ($V_{DCOP}$−Vos1−Vbias2−Vos3). In this context, during the sense phase, the third charge-storing circuit C3 stores or maintains the third differential voltage V(C3) at its pre-charge voltage level of ($V_{DCOP}$−Vos1−Vbias1−Vos2) for the duration of the sense phase. Similarly, during the sense phase, the fourth charge-storing circuit C4 stores the fourth differential voltage V(C4) at its pre-charge voltage level ($V_{DCOP}$−Vos1−Vbias2−Vos3) for the duration of the sense phase.

Also, during the sense phase, the sense circuit controller 306 may output the third control signal SW3 to turn off the third switch 424, and may output the fourth control signal SW4 to turn off the fourth switch 426. In response, the first amplifier 410 is configured to generate the first and second comparison voltages $V_{CP1}$, $V_{CP2}$ at voltage levels based on a voltage difference between a first sum input voltage and a second sum input voltage.

During the sense phase, a first portion of the storage circuitry 406 may effectively form a first input terminal 428 of the first amplifier 410 in that the first amplifier 410 generates the first comparison voltage $V_{CP1}$ based or dependent on the sum of the voltages generated on the first portion forming the first input terminal 428. The sum of the voltages generated on the first input terminal 428, otherwise referred to as the first sum input voltage, may be the sum of the voltage V1, the third differential voltage V(C3) of the third charge-storing circuit C3, and the first input offset voltage Vos1.

In addition, during the sense phase, a second portion of the storage circuitry 406 may effectively form a second input terminal 430 of the first amplifier 410, in that the first amplifier 410 generates the second comparison voltage $V_{CP1}$ based or dependent on the sum of the voltages generated on the second portion forming the second input terminal 430. The sum of the voltages generated on the second input terminal 430, otherwise referred to as the second sum input voltage, may be the sum of the second voltage V2 and the fourth differential voltage V(C4) of the fourth charge-storing circuit C4.

For some example configurations, the first amplifier 410 may be configured to have unity gain or a differential gain of one, meaning that the difference between the voltage level of the first comparison voltage $V_{CP1}$ and the voltage level of the second comparison voltage $V_{CP2}$ is equal to the difference between the voltage level of the first sum input voltage and the voltage level of the second sum input voltage. In turn, the first comparison voltage $V_{CP1}$ is equal to the first sum input voltage and the second comparison voltage $V_{CP2}$ is equal to the second sum input voltage. Generation of the first and second comparison voltages $V_{CP1}$, $V_{CP2}$ is described herein for the first amplifier 510 being a unity gain amplifier, The voltage level of the first sum input voltage, and in turn the voltage level of the first comparison voltage $V_{CP1}$ is equal to and/or dependent on the sum of the voltage levels of the first voltage V1, the third differential voltage V(C3), and the first offset voltage Vos1, which at the end of the sense phase at the third time t3, is equal to the sum of the first sense voltage amount $V_{S1}$ and the DC operating point input voltage level $V_{DCOP}$. This resulting sum can be mathematically represented by the following equations:

$$V_{CP1} = (V1 + V(C3) + Vos1)$$
$$= (Vbias1 + Vos2 + V_{S1}) + (V_{DCOP} - Vos1 - Vbias1 - Vos2) + Vos1$$
$$= V_{S1} + V_{DCOP}$$

As demonstrated by the above equations, the first amplifier 410 is configured to cancel out or otherwise be minimally influenced by the first bias voltage Vbias1, the first input offset voltage Vos1, and the second input offset voltage Vos2 when generating the first comparison voltage $V_{CP1}$ during the sense phase. That is, due to first amplifier 410 and the second amplifier 416 being configured to set the pre-charge voltage level of the third differential voltage V(C3) to depend on the first bias voltage Vbias1, the first input offset voltage Vos1, and the second input offset voltage Vos2 as subtractive components (or components with a negative polarity) in the pre-charge phase; the third charge-storing circuit C3 being configured to maintain the pre-charge voltage level of the third differential voltage V(C3) during the sense phase; the second amplifier 416 being configured to generate the first voltage V1 at a voltage level dependent on the first bias voltage Vbias1 and the second input offset voltage Vos2 as additive components during the sense phase; and the first amplifier 410 being configured to depend on the first offset voltage Vos1 as an additive component when generating the first comparison voltage $V_{CP1}$ during the sense phase, the first amplifier 410 is configured to generate the first comparison voltage $V_{CP1}$ during the sense phase at a voltage level dependent on the voltage levels of the first sense voltage amount $V_{S1}$ and the DC operating point input voltage level $V_{DCOP}$ without (or with minimized) dependency on the first bias voltage Vbias1, the first offset voltage Vos1, and the second offset voltage Vos1.

Similarly, the voltage level of the second sum input voltage, and in turn the voltage level of the second comparison voltage $V_{CP2}$ is equal to and/or dependent on the sum of the voltage levels of the second voltage V2 and the third differential voltage V(C3), which at the end of the sense phase at the third time t3, is equal to the sum of the second sense voltage amount $V_{S2}$ and the DC operating point input voltage level $V_{DCOP}$. This sum can be mathematically represented by the following equations:

$$V_{CP1} = (V2 + V(C4))$$
$$= (Vbias2 + Vos3 + V_{S2}) + (V_{DCOP} - Vbias2 - Vos3)$$
$$= V_{S2} + V_{DCOP}$$

As demonstrated by the above equations, the first amplifier 410 is configured to cancel out or otherwise be minimally influenced by the second bias voltage Vbias2 and the third input offset voltage Vos3 when generating the second comparison voltage $V_{CP2}$ during the sense phase. That is, due to first amplifier 410 and the third amplifier 418 being configured to set the pre-charge voltage level of the fourth differential voltage V(C4) to depend on the second bias voltage Vbias2 and the third input offset voltage Vos3 as subtractive components (or components with a negative polarity) in the pre-charge phase; the fourth charge-storing circuit C4 being configured to maintain the pre-charge voltage level of the fourth differential voltage V(C4) during the sense phase; and the third amplifier 418 being configured to generate the second voltage V2 at a voltage level dependent on the second bias voltage Vbias2 and the third input offset voltage Vos3 as additive components during the sense phase, the first amplifier 410 is configured to generate the second comparison voltage $V_{CP2}$ during the sense phase at a voltage level dependent on the voltage levels of the second sense voltage amount $V_{S2}$ and the DC operating point input voltage level $V_{DCOP}$ without (or with minimized) dependency on the second bias voltage Vbias2 and the third offset voltage Vos1.

At the end of (or as a final portion of) the sense phase, the comparator 412 may be configured to compare the voltage levels of the first and second comparison voltages $V_{CP1}$, $V_{CP2}$ to determine a characterization of the memory cell MC. The comparator 412 may be configured to compare the voltage levels of the first and second comparison voltages $V_{CP1}$, $V_{CP2}$ by determining the difference between the voltage levels and/or subtracting the voltage levels. In response to the comparison (e.g., the subtraction), the comparator 412 may be configured to identify which of the two voltage levels is higher. In other words, in response to the comparison, the comparator 412 may be configured to determine whether the voltage level of the first comparison voltage $V_{CP1}$ is higher or lower than the voltage level of the second comparison voltage $V_{CP2}$. In response to the comparison, the comparator 412 may generate and output the output signal OUT at a level (e.g., a voltage level) that indicates the result of the comparison. For example, if the comparator 412 determines that the voltage level of the first comparison voltage $V_{CP1}$ is higher than the voltage level of the second comparison voltage $V_{CP2}$, the comparator 412 may output the output signal OUT at a first level, and the if the comparator 412 determines that the voltage level of the first comparison voltage $V_{CP1}$ is lower than the voltage level of the second comparison voltage $V_{CP2}$, the comparator 412 may output the output signal OUT at a second level. The first level and the second level may be different levels—i.e., one may be higher than the other. The first level may indicate a first characterization of the memory cell MC, and the second level may indicate a second characterization of the memory cell MC, where the second characterization is different than the first characterization.

As previously described, the first sense voltage amount $V_{S1}$ may indicate the amount of the first current I1 drawn through the bit line BL during the sense phase, and the second voltage amount $V_{S2}$ may indicate the amount of the second current I2 drawn through the reference bit line RBL during the sense phase. The reference current source 414 may be configured to sink a predetermined amount of the reference current Iref that demarcates a threshold or boundary between two characterizations of the memory cell. For example, the amount of the reference current Iref may demarcate between two data values (e.g., logic values, n-bit bit values (where n is one or more), or binary values) that the memory cell MC can store. As another example, the amount of the reference current Iref may demarcate between the memory cell MC being sufficiently programmed and the memory cell MC being insufficiently programmed.

The amount of the cell current Icell relative to the amount of the reference current Iref may indicate the characterization of the memory cell MC. For example, where the characterization is a data value that the memory cell MC is storing, the memory cell MC drawing an amount of the cell current Icell through the bit line BL that is above the amount of the reference current Iref during the sense phase may indicate that the memory cell is storing a first data value, and the memory cell MC drawing an amount of the cell current Icell through the bit line BL that is below the reference current Iref during the sense phase may indicate that the memory cell MC is storing a second data value. As another example, where the characterization is a status of whether the memory cell MC is sufficiently programmed, the memory cell MC drawing an amount of the cell current Icell through the bit line BL that is above the amount of the reference current Iref may indicate that the memory cell MC is insufficiently programmed, and the memory cell MC drawing an amount of the cell current Icell through the bit line BL that is below the reference current Iref may indicate that the memory cell MC is sufficiently programmed (or vice versa).

As previously described, the first sense voltage amount $V_{S1}$ is indicative of the amount of the first current I1 drawn through the first charge-storing circuit C1, and in turn the bit line BL, during the sense phase. Likewise, the second sense voltage amount $V_{S2}$ is indicative of the amount of the second current I2 drawn through the second charge-storing circuit C2, and in turn the reference bit line RBL, during the sense phase. When comparing the voltage levels of the first comparison voltage $V_{CP1}$ and the second comparison voltage $V_{CP2}$ at the end of the sense phase, the comparator 412 may cancel out the DC operating point input voltage level $V_{DCOP}$. In view of the above mathematical equations, the cancellation of the DC operating point input voltage level $V_{DCOP}$ may be mathematically represented by:

$$V_{CP1}-V_{CP2}=(V_{S1}+V_{DCOP})-(V_{S2}+V_{DCOP})=V_{S1}-V_{S2}$$

As a result, the comparison that the comparator 412 performs is a comparison of the voltage levels of the first sense voltage amount $V_{S1}$ and the second sense voltage amount $V_{S1}$. Moreover, presuming that the amount of the background current Ib drawn through the bit line BL and reference bit line RBL during the sense phase is the same, the comparator 412 is further configured to cancel out the contributions that the background current Ib makes to the voltage levels of the first and second comparison voltages $V_{CP1}$, $V_{CP2}$ when performing the comparison. As a result, when comparing the voltage levels of the first and second comparison voltages $V_{CP1}$, $V_{CP2}$ at the end of the sense phase, the comparator 412 effectively compares the amount of the cell current Icell drawn through the bit line BL to the amount of the reference current Iref drawn through the reference bit line RBL during the sense phase.

In sum, through the voltage setting and voltage maintenance performed by the memory cell characterization circuitry 402, the storage circuitry 404, the switching circuitry 406, and the bit line bias circuitry 408 during the pre-charge and sense phases, the memory cell characterization circuitry 402 is able to isolate the cell current Icell and the reference current Iref from non-idealities in the sense circuit 400, including the input offset voltages Vos1, Vos2, Vos3 and the background noise current Ib, to output an output signal OUT that indicates a characterization of the memory cell MC.

In addition to the non-ideality cancellation performed during the pre-charge and sense operations, the sense circuit 400 also has certain features that allow it to perform a sense operation relatively fast. For example, by turning on the first and second switches 420, 422, the bit line biasing circuitry 408 is configured to directly bias the bit line BL and the reference bit line RBL. This configuration of directly biasing the bit line BL and the reference bit line RBL is in contrast to sense circuits having source-follower configurations, which do not directly bias the bit lines, and therefore have slower biasing times.

Another feature that the sense circuit 400 has that allows for performance of relatively fast sense operations is that it eliminates resettling time between the pre-charge and sense phases. Resettling time is the time that a sense circuit needs to change the voltage level of the bit line bias voltage $V_{BL}$ between the pre-charge phase and the sense phase. That is, if a sense circuit is configured to bias a bit line at one voltage level during the pre-charge phase and a different voltage level during the sense phase, the sense circuit needs to incur resettling time to change the voltage level. In contrast, the sense circuit 400 described with reference to FIGS. 4A and 4B is configured to maintain the bit line bias voltage $V_{BL}$ and the reference bit line bias voltage $V_{RBL}$ at constant levels during the pre-charge and sense phases, and so does not need resettling time to change voltage levels, leading to faster sense operations.

The sense circuit 400 may also be optimized for low power consumption. For example, the third and fourth charge-storing circuits C3, C4 may be configured to isolate DC voltage between the memory cell characterization circuitry 402 and the rest of the sense circuit 400. As a result, the memory cell characterization circuitry 402 may be configured to operate with a lower voltage supply compared to other active circuit components in the sense circuit 400, which in turn can reduce power consumption in the sense circuit 400.

Also, for some example configurations, each sense block 146 (FIG. 2B) may include sense circuits having the sense circuit configuration 400 described with reference to FIGS. 4A and 4B, as previously described. On memory die, the sense blocks 146, such as on the order of thousands, may simultaneously perform respective sense operations to simultaneously sense characterizations of certain target memory cells as part of an overall sense operation. Accordingly, an overall sense operation performed on a memory die 104 may include multiple sense circuits, each having the configuration of the sense circuit 400, and each connected to a respective one of a plurality of memory cells, operating simultaneously to sense characterizations of the plurality of memory cells.

Sense circuit configurations other than the one shown in FIGS. 4A and 4B may be possible. For example, another example configuration may have the configuration shown in FIGS. 4A and 4B, except that it may generate a reference voltage (i.e., the second comparison voltage $V_{CP2}$ without use of a reference bit line RBL and/or a current source 414 to generate a reference current Iref.

Also, the first input offset voltage Vos1 is described as being a non-zero value with respect to first terminal 428 associated with the bit line—i.e., as a component of the first sum voltage, along with the first sense voltage amount $V_{S1}$ indicative of the first current drawn I1 through the bit line BL. Other configurations may similarly cancel out the first input offset voltage Vos1 through characterization of the first input offset voltage Vos1 as being a non-zero value with respect to the second terminal 430—i.e., as a component of the second sum voltage, along with the second sense voltage amount $V_{S2}$ indicative of the second current I2 drawn through the reference bit line RBL. Still other example configurations may characterize the input offset voltage Vos1 being a non-zero value with respect to both the first and second terminals 428, 430—i.e., as comprising two input offset voltages, one present with respect to first input terminal 428 and the other present with respect to the second input terminal 430.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a memory cell;
   a bit line coupled to the memory cell;
   an amplifier configured to:
      during a first time period:
         set a first voltage to a predetermined voltage level adjusted by an input offset voltage of the amplifier according to a first polarity; and
         set a second voltage to the predetermined voltage level; and
      during a second time period:
         generate a first comparison voltage in response to a first sum input voltage dependent on the predetermined voltage level adjusted by the input offset voltage according to the first polarity and the input offset voltage according to a second polarity opposite the first polarity; and
         generate a second comparison voltage in response to a second sum input voltage; and
   a comparator configured to:
      upon completion of the second period, compare a voltage level of the first comparison voltage and a voltage level of the second comparison voltage; and
      output an output signal indicative of a characterization of the memory cell in response to the comparison.

2. The circuit of claim 1, wherein the amplifier comprises a first amplifier, the circuit further comprising a second amplifier configured to generate a third voltage that biases the bit line.

3. The circuit of claim 2, wherein the input offset voltage comprises a first input offset voltage, the circuit further comprising a charge-storing circuit,
   wherein the second amplifier is configured to:
      during the first time period, generate the third voltage to set a differential voltage of the charge-storing circuit to depend on a second input offset voltage of the second amplifier according to a third polarity;
      during the second time period, generate the third voltage to depend on the second input offset voltage according to a fourth polarity opposite the third polarity,
   wherein the first amplifier is configured to, during the second time period, generate the first comparison voltage in response to the first sum input voltage further dependent on the differential voltage of the charge storing circuit and the third voltage dependent on the second input offset voltage according to the fourth polarity.

4. The circuit of claim 3, wherein the charge-storing circuit comprises a first charge-storing circuit, wherein the differential voltage comprises a first differential voltage, the circuit further comprising a second charge-storing circuit and a switch connected in parallel with the second charge storing circuit, and wherein:
   during the first time period, the switch is configured to turn on to bias the bit line and to set a second differential voltage of the second charge-storing circuit to an initial voltage level.

5. The circuit of claim 4, wherein, during the second time period:
   the switch is configured to turn off; and
   in response to the switch turning off, the second charge-storing circuit is configured to draw current and change the second differential voltage by a sense voltage amount indicative of current flow through the second charge-storing circuit during the second period.

6. The circuit of claim 1, further comprising:
   a first switch configured to connect a first output terminal of the amplifier to a first input terminal of the amplifier, and a second switch configured to connect a second output terminal of the amplifier to a second input terminal of the amplifier,
   wherein the first switch and the second switch are configured to turn on during the first time period, and
   wherein the first switch and the second switch are configured to turn off during the second time period.

7. The circuit of claim 1, wherein the comparator is configured to cancel out the predetermined voltage level during comparison of the voltage levels of the first comparison voltage and the second comparison voltage.

8. The circuit of claim 1, wherein the first polarity comprises a negative polarity and the second polarity comprises a positive polarity.

9. The circuit of claim 1, further comprising:
a charge-storing circuit; and
a reference bit line coupled to the charge-storing circuit,
wherein, during the second time period, the charge-storing circuit and the reference bit line are configured to draw a current,
wherein the charge-storing circuit is configured to change a differential voltage by a sense voltage amount based on the current drawn during the second time period, and
wherein the amplifier is configured to generate the second comparison voltage in response to the second sum input voltage based on the sense voltage amount.

10. A circuit comprising:
an amplifier;
storage circuitry configured to:
during a sense phase of a sense operation:
maintain a first differential voltage based on a first voltage; and
maintain a second differential voltage based on a second voltage;
switching circuitry configured to:
during a pre-charge phase of the sense operation:
connect a first output terminal of the amplifier to a first node of a first input terminal of the amplifier to generate the first voltage; and
connect a second output terminal of the amplifier to a second node of a second input terminal of the amplifier to generate the second voltage; and
during the sense phase:
disconnect the first output terminal from the first node and the second output terminal from the second node,
wherein the amplifier, in response to the disconnection, is configured to generate a first comparison voltage based on the first differential voltage and a second comparison voltage based on the second differential voltage; and
a comparator configured to indicate a behavior of a memory cell in response to being biased during the sense operation based on the first comparison voltage and the second comparison voltage upon completion of the sense phase.

11. The circuit of claim 10, wherein the amplifier comprises a first amplifier, the circuit further comprising a second amplifier configured generate an output voltage to bias a bit line coupled to the memory cell.

12. The circuit of claim 11, wherein the second amplifier is configured to:
during the pre-charge phase, generate the output voltage to set the first differential voltage to depend on an input offset voltage of the second amplifier according to a first polarity; and
during the sense phase, generate the output voltage to depend on the input offset voltage according to a second polarity opposite the first polarity,
wherein the first amplifier is configured to, during the second time period, generate the first comparison voltage in response to a first sum input voltage dependent on the first differential voltage and the output voltage dependent on the input offset voltage according to the second polarity.

13. The circuit of claim 12, wherein the storage circuitry comprises a charge-storing circuit, wherein the circuit further comprises a switch connected in parallel with the charge storing circuit, and wherein:
during the pre-charge phase, the switch is configured to turn on to bias the bit line and to set a third differential voltage of the charge-storing circuit to an initial voltage level.

14. The circuit of claim 13, wherein, during the sense phase:
the switch is configured to turn off; and
in response to the switch turning off, the charge-storing circuit is configured to draw current and change the third differential voltage by a sense voltage amount indicative of current flow through the second charge-storing circuit during the second period.

15. The circuit of claim 11, further comprising:
a charge-storing circuit; and
a reference bit line coupled to the charge-storing circuit,
wherein, during the sense phase, the charge-storing circuit and the reference bit line are configured to draw a current,
wherein the charge-storing circuit is configured to change a third differential voltage by a sense voltage amount based on the current drawn during the second time period, and
wherein the amplifier is configured to generate the second comparison voltage in response to the second sum input voltage based on the sense voltage amount.

16. A system comprising:
a memory cell;
a bit line connected to the memory cell;
a reference bit line;
a first amplifier configured to:
bias the bit line with a bit line bias voltage;
during a pre-charge phase of a sense operation, set a first differential voltage of a first charge-storing circuit to depend on a first input offset voltage of the first amplifier; and
during a sense phase of the sense operation, generate a first output voltage dependent on a first sense voltage amount and the first input offset voltage, wherein the first sense voltage amount is indicative of a first current drawn through the bit line;
a second amplifier configured to:
bias the reference bit line with a reference bit line bias voltage;
during a pre-charge phase of the sense operation, set a second differential voltage of a second charge-storing circuit to depend on a second input offset voltage of the second amplifier; and
during a sense phase of the sense operation, generate a second output voltage dependent on a second sense voltage amount and the second input offset voltage, wherein the second sense voltage amount is indicative of a second current drawn through the bit line;
a third amplifier configured to, during the sense phase:
generate a first comparison voltage dependent on the first differential voltage and the first output voltage; and
generate a second comparison voltage dependent on the second differential voltage and the second output voltage; and
a comparator configured to:
compare the first comparison voltage and the second comparison voltage; and in response to the comparison, generate an output signal indicative of a behavior of the memory cell in response to being biased during the sense operation.

17. The system of claim 16, further comprising a third charge-storing circuit and a fourth charge-storing circuit, wherein, during the sense phase:
- the third charge-storing circuit is configured to draw the first current to increase a third differential voltage by the first sense voltage amount; and
- the fourth charge-storing circuit is configured to draw the second current to increase a fourth differential voltage by the second sense voltage amount.

18. The system of claim 17, wherein, between the pre-charge phase and the sense phase, the first amplifier and the third charge-storing circuit are configured to maintain the bit line bias voltage at a constant level, and wherein the second amplifier and the fourth charge-storing circuit are configured to maintain the reference bit line bias voltage at a constant level.

19. The system of claim 16, wherein during the pre-charge phase, the first amplifier and the second amplifier are configured as unity gain amplifiers.

20. The system of claim 16, wherein the third amplifier is configured to:
- during the pre-charge phase, set the first differential voltage to further depend on a third input offset voltage of the third amplifier according to a first polarity; and
- during the sense phase, generate the first comparison voltage to further depend on the third input offset voltage according to a second polarity opposite the first polarity.

* * * * *